US 6,703,879 B2

(12) United States Patent
Okuda et al.

(10) Patent No.: US 6,703,879 B2
(45) Date of Patent: Mar. 9, 2004

(54) CLOCK GENERATION CIRCUIT, CONTROL METHOD OF CLOCK GENERATION CIRCUIT AND SEMICONDUCTOR MEMORY DEVICE

(75) Inventors: Yuichi Okuda, Higashimurayama (JP); Hideo Chigasaki, Kunitachi (JP); Hiroki Miyashita, Hachioji (JP)

(73) Assignees: Renesas Technology Corporation, Tokyo (JP); Hitachi Device Engineering Co., Ltd., Chiba (JP)

( * ) Notice: Subject to any disclaimer, the term of this patent is extended or adjusted under 35 U.S.C. 154(b) by 0 days.

(21) Appl. No.: 09/908,857

(22) Filed: Jul. 20, 2001

(65) Prior Publication Data

US 2002/0008558 A1 Jan. 24, 2002

(30) Foreign Application Priority Data

Jul. 24, 2000 (JP) ........................................ 2000-222309

(51) Int. Cl.[7] ................................................ H03L 7/06
(52) U.S. Cl. ........................ 327/158; 327/161; 327/175; 375/376; 331/DIG. 2
(58) Field of Search ................................ 327/291, 295, 327/296, 299, 165, 172–175, 155–158, 161, 261, 284, 287; 331/1 A, DIG. 2, 177 R; 375/371, 373–376

(56) References Cited

U.S. PATENT DOCUMENTS

| 5,757,218 A | * | 5/1998 | Blum | 327/172 |
| 5,883,534 A | | 3/1999 | Kondoh et al. | 327/156 |
| 5,939,913 A | | 8/1999 | Tomita | 327/158 |
| 6,011,732 A | * | 1/2000 | Harrison et al. | 365/191 |
| 6,157,234 A | * | 12/2000 | Yamaguchi | 327/175 |
| 6,242,954 B1 | * | 6/2001 | Taniguchi et al. | 327/149 |

FOREIGN PATENT DOCUMENTS

| JP | 6-29835 | 2/1994 |
| JP | 9-321614 | 12/1997 |
| JP | 10150350 | 6/1998 |
| JP | 10294649 | 11/1998 |
| JP | 1115555 | 1/1999 |
| JP | 1117529 | 1/1999 |
| JP | 1186545 | 3/1999 |

* cited by examiner

Primary Examiner—Minh Nguyen
(74) Attorney, Agent, or Firm—Antonelli, Terry, Stout & Kraus, LLP

(57) ABSTRACT

A clock generation circuit including a clock duty adjusting circuit in the subsequent stage of a variable delay circuit to control the delay of the variable delay circuit with the rising edge of an external clock. When the phase of the rising edge is matched with the reference clock, the duty of an output clock is matched with the duty of the reference clock by adjusting the pulse width of the signal with the duty adjusting circuit at the falling edge.

15 Claims, 12 Drawing Sheets

CLOCK GENERATION CIRCUIT, CONTROL METHOD OF CLOCK GENERATION CIRCUIT AND SEMICONDUCTOR MEMORY DEVICE

BACKGROUND

The present invention relates to a clock generation circuit for generating an internal clock signal synchronized with an external clock signal and moreover a DLL (Delay Locked Loop) circuit which can adjust a duty ratio and moreover to the technique which can effectively be utilized for the clock generation circuit for generating the clock signal to determine the output timing, for example, in the SDRAM (Synchronous Dynamic Random Access Memory).

In recent years, attention has been paid to the SDRAM of the DDR (Double Data Rate) system, as a means for realizing higher data transfer rate of the SDRAM, for inputting and outputting the data in the doubled transmission rate of the input clock. In view of realizing the input/output of data in the higher transmission rate, the DDR SDRAM mounts a clock generation circuit called a DLL and a SMD for the matching between the phases of external clock and data output. This phase matching is required to acquire the sufficient set-up time of the output data for external clock. When the phase of external clock is matched with the phase of data output, the time required until the data is outputted from the input of the read command becomes equal to the integer times of the period of the external clock.

The official gazette of the Japanese Published Unexamined Patent Application No. HEI 6(1994)-29835 discloses, as illustrated in FIG. 16, a loop type phase adjusting circuit including a rising phase difference detecting means 33 for generating the first control signal VC1 indicating a phase difference by detecting the rising phase difference between the reference clock signal CREF and internal clock signal CIN and a falling phase difference detecting means 34 for generating the second control signal VC2 indicating a phase difference by detecting the falling phase difference between both clock signals. Meanwhile, the official gazette of HEI 11(1999)-15555 discloses a synchronization circuit corresponding to the DDR specifications for respectively executing independent phase comparison operations of the internal clock signal ICLKT-2R of the clock system generated from the rising edge of external clock signal ECLK and the internal clock signals ICLKT-2F and ICLKB-2F of the clock system generated from the falling edge of external clock signal ECLK.

The official gazette of HEI 9(1997)-321614 (corresponding U.S. Pat. No. 5,883,534) discloses, as illustrated in FIG. 2, a clock supply device 501 which is provided between the DLL apparatus 1 and a clock driver 3 and includes a waveform shaping device 2 as a duty ratio recovery device for converting the input clock IN having the desired duty ratio to the clock having the duty ratio of 50%.

The official gazette of HEI 11(1999)-17529 discloses a DLL circuit which is formed of a basic clock generation unit, a phase detecting unit, a phase adjusting unit and a circuit DCC11 for adjusting the duty of output stage to 50%.

The official gazette of HEI 10(1998)-264649 discloses a frequency multiplying circuit which is formed of a phase frequency detector 30 as a phase difference detector for detecting phase difference between the input signal f1 and the signal fed back from a voltage-controlled delay circuit 32 explained later, a loop filter 31 for outputting a control signal depending on the phase difference detected with the phase frequency detector 30, the aforementioned voltage-controlled delay circuit 32 for changing a delaying coefficient of the input signal depending on the control signal from the loop filter 31 and feeding back this input signal to the phase frequency detector 30, the first SR flip-flop 33 for outputting the signal of duty ratio of 25% by receiving a pair of output signals among the signals frequency-divided four signals which are sequentially outputted from the voltage-controlled delay circuit 32, the second SR flip-flop 34 for outputting the signal of duty ratio of 25% by receiving a pair of output signals among the frequency-divided four signals which are sequentially outputted from the voltage-controlled delay circuit 32 and an OR gate 35 for outputting the signal of duty ratio of 50% with logical OR calculation of the outputs of these first and second SR flop—flop circuits 33, 34.

The official gazette of HEI 11(1999)-86545 (corresponding U.S. Pat. No. 5,939,913) discloses the DLL circuit applied to the SDRAM of the DDR system.

The official gazette of HEI 10(1998)-150350 discloses a phase synchronous circuit including a synchronous Miller delay type synchronous circuit for generating the clock signal synchronized with the rising edge of external clock and a synchronous Miller delay type synchronous circuit for generating the clock signal which is deviated by the half-period from the rising edge of external clock in order to obtain the internal clock of the desired duty ratio not depending on the waveform of external clock signal by combining these two output clock signals.

SUMMARY OF THE INVENTION

The DLL (Delay Locked Loop) circuit used as a clock generation circuit delays the input clock and controls a degree of delay in order to generate the clock having the desired phase. However, in the DLL circuit of the related art generates difference of a degree of delay at the rising edge and falling edge of the clock due to the influence of unbalance of the circuit operation in the process of delaying the clock and thereby there is a possibility for generation of difference in the duty ratio of the input clock (ratio of high level period for one period) and the duty ratio of the output clock (hereinafter, referred to only as duty). In order to prevent deviation of duty of clock, the phase must be controlled independently at the rising edge and falling edge of the clock.

As the DLL circuit for individually controlling the amount of delay at both edges, discussion has been made for a variable delay circuit for individually controlling the amount of delay of the rising edge and falling edge of the clock and a circuit of the system including a phase comparator corresponding to both edges and for effectuating the feedback to the variable delay circuit through independent phase comparison at both edges.

Moreover, the DLL circuit including two kinds of delay circuits for both rising and falling edges to individually control the amount of delay of both edges has also been discussed.

Although various circuit systems have been proposed as the variable delay circuit for DLL, the inventors of the present invention have also discussed additionally that the available circuit may be limited in the case of using the variable delay circuit which can individually control the amount of delay of both rising edge and falling edge in order to prevent deviation of duty of the clock. Therefore, since a degree of freedom of design flexibility is lowered and the performance of the DLL circuit is determined with the performance of the variable delay circuit, limitation in the kind of variable delay circuit means limitation of performance of the DLL circuit.

Meanwhile, when the two kinds of delay circuits for rising and falling edges of the clock are used, there rises a problem that the circuit area and current dissipation of the system mounting the DLL circuit increase because the circuit size and current dissipation increase remarkably.

An object of the present invention is to provide a clock generation circuit for eliminating deviation of duty of the output clock which interferes the phase control to realize high precision phase control only by adding a simplified circuit.

The aforementioned and the other objects and novel features of the present invention will become apparent from the description of the present invention and the attached drawings thereof.

The summary of typical inventions among those disclosed in this specification will be explained as follows.

The present invention is provided with at least one input terminal, at least one output terminal, a fixed delay granting means for granting, to the input signal, the predetermined delay corresponding to the period from the time when a signal is inputted to the input terminal to the time when a signal is outputted from the output terminal, a variable delay circuit provided with a delay time control terminal for giving a certain delay time to the input signal depending on a control voltage applied to the delay time control terminal and then outputting such signal having a certain delay time, a duty adjusting circuit provided with a duty control terminal for adjusting a duty ratio by changing a pulse width of the input signal depending on the control voltage applied to the duty control terminal, a delay time control means for generating the delay time control voltage and a duty control means for generating a control voltage applied to the duty control terminal.

According to the means explained above, since the duty adjusting circuit is provided independent of the variable delay circuit, the duty ratio can be adjusted without considering the variable delay circuit of the individual circuit system and therefore a degree of freedom for design becomes high and performance of the clock generation circuit is never limited with the performance of the variable delay circuit. Moreover, since the duty adjusting circuit adjusts the duty ratio by varying the pulse width of the signal, the size of circuit may be reduced in comparison with that of the system for adjusting the duty ratio by respectively controlling the phases of the rising edge and falling edge of the input signal with the individual DLL circuits having respective variable delay circuits.

The fixed delay granting means is constituted to grant, to the input signal, a fixed delay corresponding to the sum of the delay generated in the signal path up to the variable delay circuit from the input terminal and the delay generated in the signal path up to the output terminal from the variable delay circuit. Thereby, the internal clock signal, which is synchronized with the externally inputted clock signal and gives the timing to output the desired signal depending on the changing point of synchronization, can be generated.

Moreover, the delay time control means is comprised of a phase comparison circuit for comparing the phase of the signal outputted from the fixed delay granting means with the phase of the signal inputted to the variable delay circuit to output the signal depending on phase difference, and a control voltage generating means for generating a control voltage applied to the delay time control terminal based on the signal depending on the phase difference outputted from the phase comparison circuit. Thereby, automatic phase matching with a feedback loop also becomes possible.

Moreover, the duty control means is comprised of a second phase comparison circuit for comparing the phase of the signal in the output side of the variable delay circuit with the phase of the signal in the variable delay circuit to output the signal depending on the phase difference and a second control voltage generating means for generating a control voltage applied to the duty control terminal based on the signal depending on the phase difference outputted from the second comparison circuit. Thereby, the duty control means may be formed as the circuit structure similar to the delay time control means and accordingly the circuit design can be simplified.

Moreover, it is preferable to provide the structure that the duty adjusting circuit is provided in the successive stage of the variable delay circuit and the fixed delay granting means is provided in the successive stage of the duty adjusting circuit and the duty adjusting circuit can also vary, in addition, the pulse width to make identical the duty ratio of the signal outputted from the fixed delay granting means to that of the input signal of the variable delay circuit. Although it is also possible to comprise the duty adjusting function in the variable delay circuit, but the optimum design of each circuit is possible and performance of the circuit can further be enhanced by individually forming the duty adjusting circuit independent of the variable delay circuit. Moreover, the duty adjusting circuit can adjust the duty ratio through only variation of pulse width of the signal by providing the duty adjusting circuit in the successive stage side of the variable delay circuit and then providing the fixed delay granting means to the successive stage side of the duty adjusting circuit.

Moreover, it is also preferable that the delay time control means compares the phase of the rising edge or falling edge of the signal inputted to the variable delay circuit with the phase of the rising edge or falling edge of the signal outputted from the fixed delay granting means, to generate the control voltage applied to the delay time control terminal depending on the phase difference. The duty control means compares the phase of the falling edge or rising edge of the signal inputted to the variable delay circuit with the phase of the falling edge or rising edge of the signal outputted from the fixed delay granting means, to generate the control voltage applied to the duty control terminal depending on the phase difference. Thereby, the variable delay circuit controls amount of delay of clock with reference to one edge of the clock and the duty adjusting circuit controls the duty ratio by changing the pulse width of clock with reference to the other edge of clock. As a result, high precision phase control becomes possible for both the rising edge and falling edge of clock and the duty of the output clock can be accurately matched with the duty of the input clock.

The variable delay circuit is constituted to output a differential signal by delaying the input differential signal and also defines the signal outputted from the fixed delay granting circuit as the differential signal, while the duty control means is constituted to generate the control voltage applied to the duty control terminal based on the differential signal outputted from the fixed delay granting means. Thereby, even if delay of the variable delay circuit is different in the normal phase side and inverse phase side, accurate duty adjustment is possible.

Moreover, the phase comparison circuit forming the delay time control means is constituted to output a signal indicating lead or delay of the phases of two signal to be compared with each other and is also constituted to also include a phase lock determining means for determining the phase lock condition based on the signal indicating lead or delay of the phase so that the duty control means select the signal depending on the phase difference outputted from the second phase comparison circuit or the differential signal outputted from the fixed delay granting means based on the signal indicating the phase lock condition outputted from the phase lock determining means in view of generating the control voltage applied to the duty control terminal based on the selected signal.

The clock generation circuit comprises at least one input terminal, at least one output terminal, a fixed delay granting means for granting the predetermined delay corresponding to the period from the time when the signal is inputted to the input terminal to the time when the signal is outputted from the output terminal, a variable delay circuit including a delay time control terminal to give delay to the input signal depending on the control voltage applied to the delay time control terminal and then output such delayed signal, a duty adjusting circuit provided with a duty control terminal to adjust a duty ratio by changing the pulse width of the signal inputted depending on the control voltage to the duty control terminal, a delay time control means for generating a delay time control voltage and a duty control means for generating the duty control voltage. In this circuit, after the variable delay circuit adjusts the phase of signal based on any one of the rising edge or falling edge of the input signal, the duty adjusting circuit adjusts the duty ratio based on the other edge.

Thereby, the phase lock at the rising edge may be realized, even under the condition that amount of delay at the falling edge in the operation of the variable delay circuit becomes larger but amount of delay at the rising edge does not become large, by controlling the duty of the output clock to 50% until the phase is locked at the rising edge from the start of operation of the circuit.

In addition, in a semiconductor memory device including a clock generation circuit of the structure explained above, the semiconductor memory device which assures matching of the phases between the output data and the external clock with higher accuracy and has an extra setup time can be realized by forming the structure that the clock signal generated by inputting an external clock signal to the clock generation circuit is outputted as the timing signal.

DETAILED DESCRIPTION

Figure 1:
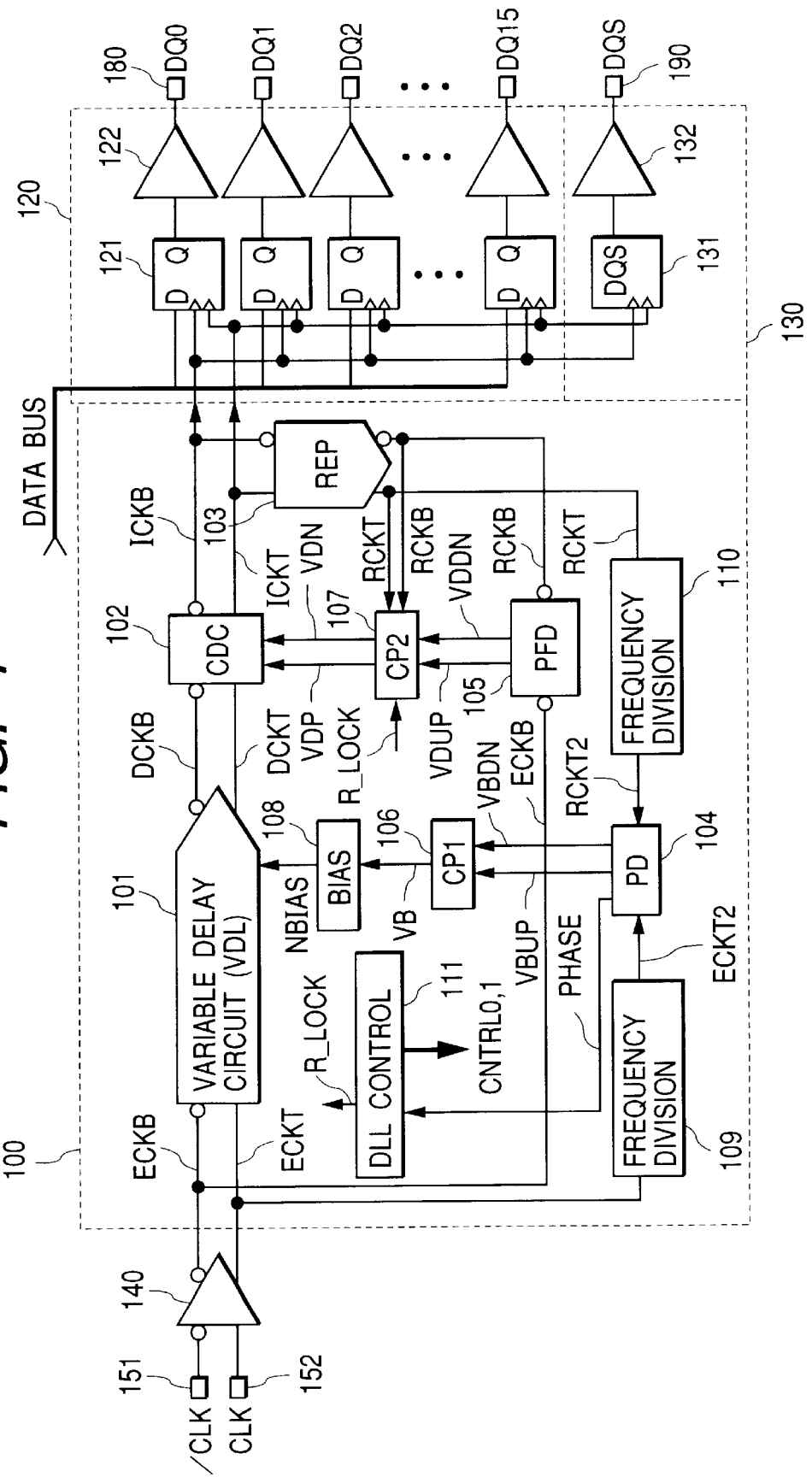
FIG. 1 is a block diagram illustrating a schematic structure of an embodiment of the DLL circuit to which the present invention is applied.

FIG. 1 illustrates an embodiment wherein the present invention is applied to the clock generation circuit using the DLL (Delay Locked Loop) in the DDR SDRAM.

First, a structure will be explained briefly. A reference numeral 100 designates a clock generation circuit (or clock re-generation circuit) using the DLL; 120, an output circuit which can output in parallel the data, for example, of 16-bit data DQ0 to DQ15; 130, an output circuit of the data strobe signal DQS giving the timing to extract the data DQ0 to DQ15 in the same period and same phase as the data DQ0 to DQ15; 140, an input buffer circuit of the external clock CLK, /CLK; 151, an input terminal of external clock CLK; 152, an input terminal of the clock /CLK of inverse phase; 180, an output terminal of the above data DQ0 to DQ15 and 190 an output terminal of the data strobe signal DQS. An output circuit 120 is comprised of the data latch circuit 121 and the output buffer circuit 122 provided corresponding to each bit of the output data DQ0 to DQ15.

The clock generation circuit 100 is comprised of a variable delay circuit (VDL) 101 for delaying inputted external clocks CLK, /CLK, a duty adjusting circuit (CDC) 102 for adjusting the duty of clock delayed in the variable delay circuit 101, a replica delay circuit (REP) 103 for having amount of delay corresponding to the sum (t1+t3) of the delay t1 of the input buffer 140 and delay t3 of the data latch circuit 121 and output buffer circuit 122, a frequency-dividing circuit 109 for dividing the frequency of the external clock ECKT fetched with the input buffer 140, a frequency-dividing circuit 110 for dividing the frequency of the output RCKT of the replica delay circuit 103, a phase comparator (PD) 104 for comparing the phases of the clocks ECKT2 and RCKT2 which are frequency-divided with the frequency dividing circuits 109, 110, a charge pump circuit 106 for generating a voltage VB depending on the phase difference based on the outputs VBUP, VBDN of the phase comparator 104, a bias circuit 108 for generating the delay control signal NBIAS for the variable delay circuit 101 based on the generated voltage VB and a DLL control circuit 111 for controlling operations of the variable delay circuit 101 and charge pump circuit 106, etc.

Moreover, the clock generation circuit 100 of this embodiment is constituted to also provide a phase frequency comparator (PFD) 105 for comparing the phases of the external clock ECKB fetched with the input buffer 140 and the other output RCKB of the replica delay circuit 103 to control the duty adjusting circuit 102 with the outputs VDP, VDN of this phase frequency comparator 105.

The DLL control circuit 111 generates the control signal for the DLL as a whole. The signal PHASE indicating the phase comparison result is supplied from the phase comparator 104 and the control signals CNTRL0, CNTRL1 and R_LOCK and the other various control signals for the charge pump circuits 106, 107 are generated from the DLL control circuit 111, but FIG. 1 illustrates only the signal in relation to content of the present invention.

Next, functions and operations of the clock generation circuit 100 of this embodiment will be explained.

As explained above, the clock generation circuit 100 in the DDR SDRAM adjusts the phase of internal clock QCLK so that the phases of the output data DQ0 to DQ15 are matched with the phase of the input clocks CLK, /CLK.

Here, the delay of the clock input buffer 140 is defined as t1, total delay of the variable delay circuit 101 and duty adjusting circuit 102 as t2 (variable), total delay of the data output latch 121 and data output buffer 122 as t3 and delay of the frequency-dividing circuit 109 and the frequency-dividing circuit 110 as tDIV. Since the replica delay circuit 103 gives the desired phase to the clock QCKT delayed with the variable delay circuit 101, it is given the delay (t1+t3) which is equal to the clock access time. The phase comparator 104 outputs the VPUP and VPDN signals realize matching of the phases of clocks ECKT2 and RCKT2 that are frequency-divided with the frequency dividing circuits 109 and 110 in order to control the value of delay t2 of the variable delay circuit 101.

Accordingly, when the period of the external clocks CLK, /CLK is assumed as tCK in the clock generation circuit 100, delay of the output side clock QCKT of the duty adjusting circuit 102 for CLK, /CLK is expressed as t1+t2 because it is equal to the sum of delay t1 of the input buffer 140 and delay t2 of the variable delay circuit 101 and duty adjusting circuit 102.

In the same manner, delay of the output side clock RCKT2 of the frequency-dividing circuit 110 is expressed as t1+t2+tDIV+(t1+t3).

On the other hand, delay in the output side clock ECKT2 of the frequency-dividing circuit 109 is expressed as t1+tDIV.

Here, since the control is performed to make the phase of RCKT2 equal to the phase of ECKT2, if the phase matching is conducted in the one clock cycle, following formula can be set up. Namely, $$t1+t2+tDIV+(t1+t3)=t1+dDIV+tCK \qquad (1)$$

This formula can be simplified to $$t2=tCK-(t1+t3)$$

$$t1+t2+t3=tCK$$

Figure 2A:
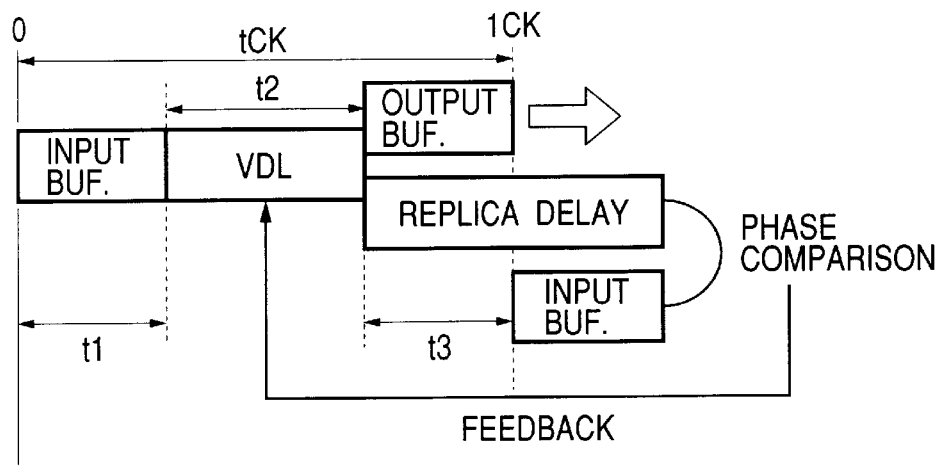
FIGS. 2A, 2B are explanatory diagrams illustrating a relationship between the period of external clock and internal delay in the 1CK lock condition and 2CK lock condition in the DLL circuit of the embodiment.

This will be explained based on the figures. It means, as illustrated in FIG. 2A, that delay t2 of the variable delay circuit 101 is controlled so that the sum (t1+t2+t3) of the delay t1 of the input buffer 140, delay of the variable delay circuit 101 and duty adjusting circuit 102 and delay t3 of the output latch 121 and data output buffer 122 becomes equal to the period tCK of the external clocks CLK, /CLK.

Above explanation is effective when the phase matching is performed in the one clock cycle. In the clock generation circuit 100 of FIG. 1, the phase matching may be performed within the n clock cycles (n is a natural number), in place of the one clock cycle under the condition that the delay t2 of the variable delay circuit 101 can logically be controlled within the range from 0 to infinity. It can be expressed as follows.

$$t1+t2+tDIV+(t1+t3)t1+tDIV+n \times tCK$$

This formula can be simplified as $$t2=n \times tCK-(t1+t3)$$

Therefore, delay of QCLK becomes equal to n×tCK−t3. Moreover, delay of the output data DQ0 to DQ15 is equal to the sum of the delay (n×tCK−3) of QCLK and delay t3 of the output latch 121 and data output buffer 122 and accordingly it is expressed as n×tCK. Therefore, the phase of the output data DQ0 to DQ15 is set equal to the phase of the input clocks CLK, /CLK. Thereby, it can be understood that the total value of the delay t2 of the variable delay circuit 101 and clock access time (t1+t3) becomes equal to n×tCK. Namely, $$t2+(t1+t3)=n \times tCK \qquad (2)$$

Here, n is a desired natural number. The case where the clock generation circuit 100 is phase-locked with the number of cycles n is called, for example, as 1CK lock, 2CK lock, ..., nCK lock.

Figure 2B:
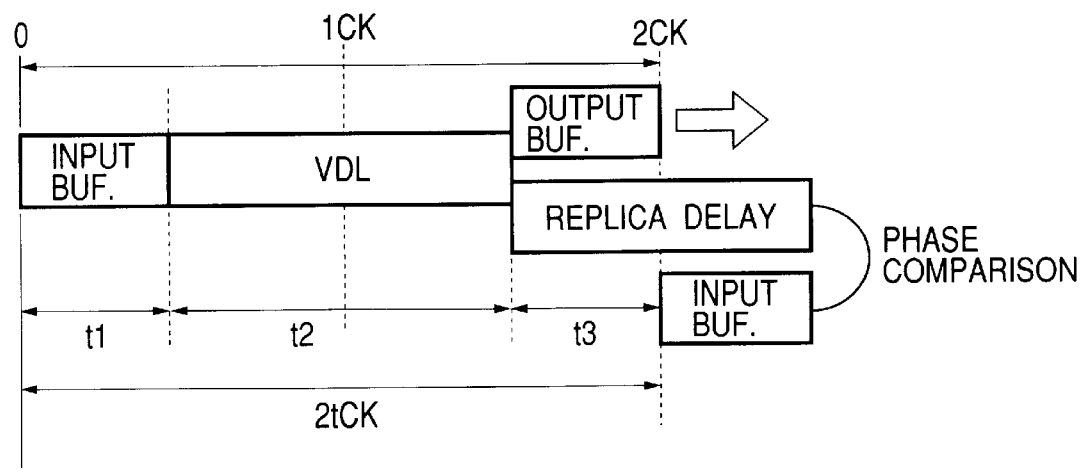

FIG. 2B illustrates the relationship between the sum (t1+52+t3) of the delay t1 of the input buffer 140, delay t2 of the variable delay circuit 101 and delay t3 of the output latch 121 and data output buffer 122 and the clock cycle tCK. In the case of the 2CK lock, as illustrated in FIG. 2B, the delay t2 of the variable delay circuit 101 is controlled to result in the relationship of (t1+t2+t3)=2tCK. In the same manner, the delay t2 of the variable delay circuit 101 is controlled to provide the relationship of (t1+t2+t3)=3tCK. Hereinafter, the 1CK lock is assumed, unless otherwise described particularly.

Moreover, in this embodiment, the phases of the clocks obtained by dividing the frequencies of ECKT and RCKT to ½ respectively are compared with each other by providing the frequency-dividing circuits 109, 110 to the preceding stage of the phase comparator 107 in order to prevent erroneous operations due to the harmonic lock.

Figure 3:
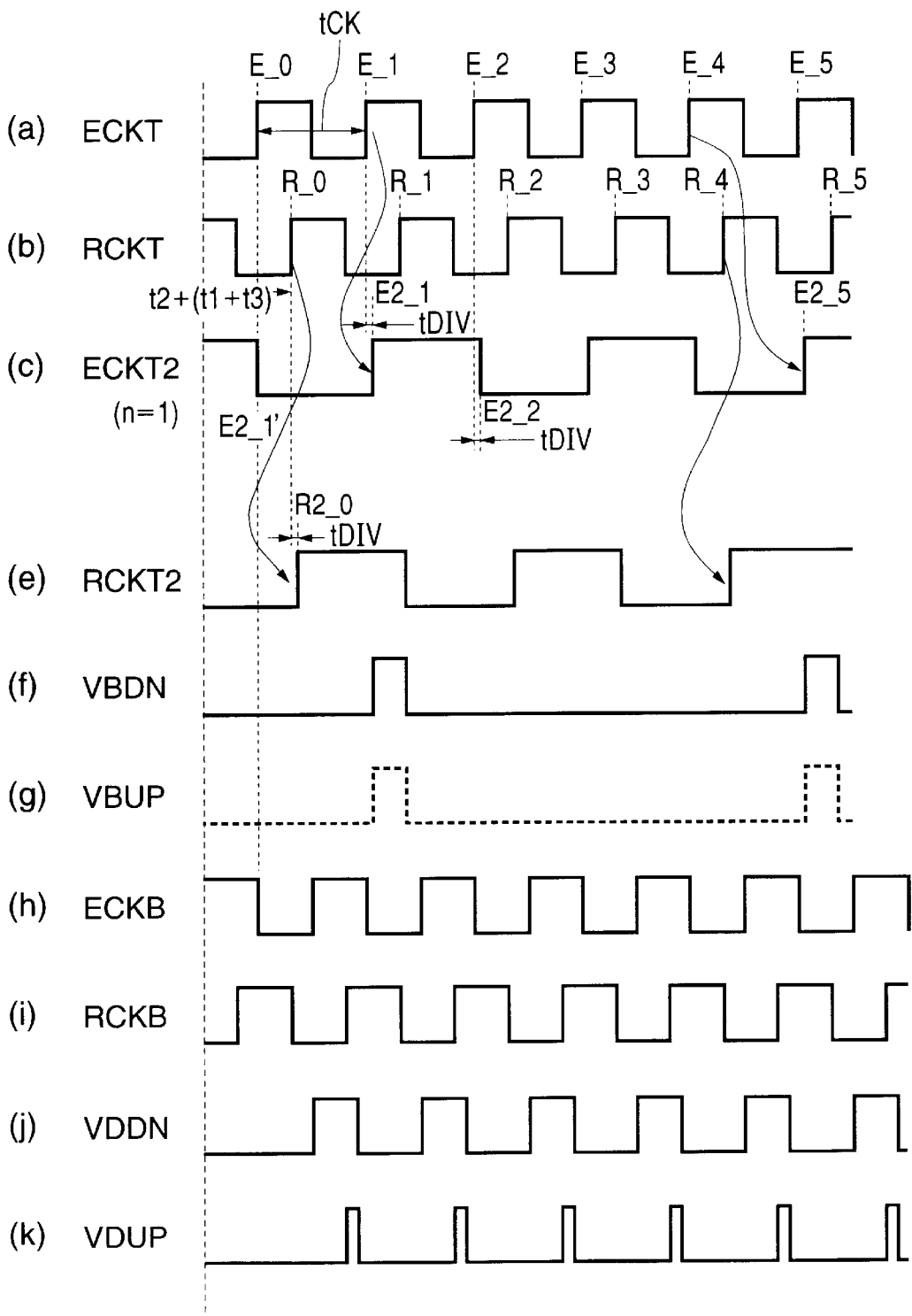
FIGS. 3A to 3K are timing diagrams for explaining the harmonic lock in the DLL circuit of the embodiment.

The harmonic lock and measures for it will then be explained with reference to FIG. 3. First, since the delay of the variable delay circuit 101 is minimum value, the value of t2+(t1+t3) is also the minimum value.

When the external clocks CLK, /CLK are inputted, the rising edge E_0 of the clock ECKT depending on such external clock becomes the rising edge R_0 of the clock RCKT passing through the variable delay circuit 101 and replica delay circuit 103. The total delay up to the edge R_0 from E_0 is equal to t2+(t1+t3). In the same manner, the edge E_2 becomes R_2 and E_3 becomes R_3. Here, when considering the case where the period tCK of the external clocks CLK, /CLK and t2+(t1+t3)<tCK/2 as illustrated in FIGS. 3A, 3B, the rising edge of the clock ECKT of which phase is nearest to the rising edge R_0 of the clock RCKT becomes E_0. Therefore, when the phase control is conducted by inputting in direct the clocks ECKT, RCKT to the phase comparator 104, control is executed in the direction to make small the delay t2 of the variable delay circuit 101 to match the phase of R_0 with E_0. However, since the delay t2 of the variable delay circuit 101 is the minimum value in this timing, it is impossible to match the rising edge of the clock RCKT with the rising edge of the clock ECKT. This condition is called the erroneous operation due to the harmonic lock.

In view of preventing erroneous operation due to the harmonic lock, the DLL of FIG. 1 is provided with the frequency-dividing circuits 109 and 110. Therefore, the clock RCKT2 outputted from the frequency-dividing circuit 110 has the phase and period as illustrated in FIG. 3E. Namely, the frequency-dividing circuit 110 generates the rising edge R2_0 of RCKT2 from the rising edge R_0 of the clock RCKT. The clock ECKT2 outputted from the ½-frequency-dividing circuit 109 has the phase as illustrated in FIG. 3C. Namely, the frequency-dividing circuit 109 generates the rising edge E2_1 of ECKT2 from the rising edge E_1 of the clock ECKT.

Here, delay up to R2_0 from R_0, delay up to E2_1 from E_1 and delay up to E2_2 from E2 are all equal to tDIV.

When these clocks ECKT2, RCKT2 are inputted to the phase comparator 104 to conduct the phase comparison, the rising edge of the ECKT2 nearest to the rising edge R2_0 of RCKT2 is E2_1. Therefore, in this case, the phase comparator 104 outputs the down signal VBDN to match the rising edge E2_1 of the ECKT2 with the rising edge R2_0 of RCKT2 (refer to FIG. 3F). Thereby, the delay time t2 of the variable delay circuit 101 increases and accordingly erroneous operation by the harmonic lock can be prevented.

In above explanation, the value of n is assumed as 1 (n=1), but the similar system can also be applied to the cases where n=2, 3 and 4. However, 1/(2n)-frequency-dividing circuit is required, for example, when n=1, (½)-frequency-dividing circuit may be used, but when n=2, (¼)-frequency-dividing circuit is required, and when n=3, (⅙)-frequency-dividing circuit is required and when n=4, (⅛)-frequency-dividing circuit is required.

Figure 4:
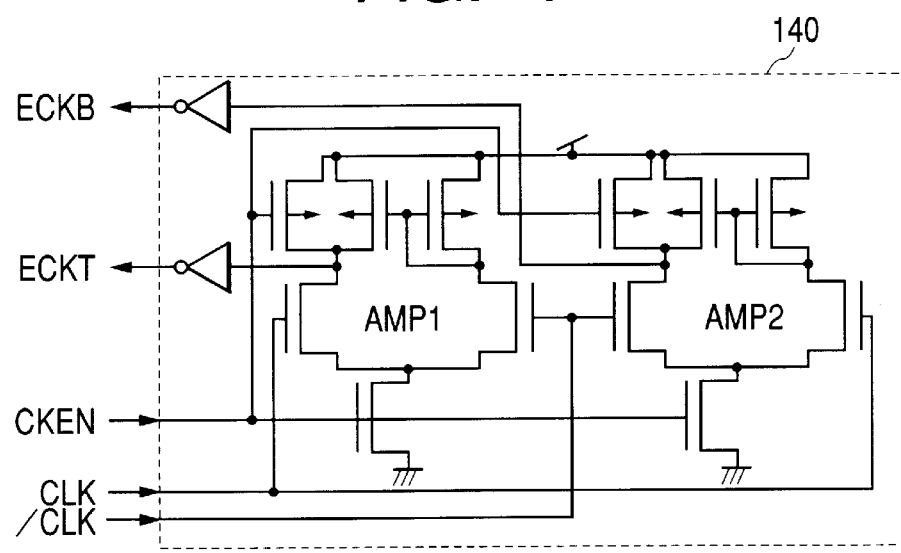
FIG. 4 is a circuit diagram illustrating a practical example of an input buffer circuit in the SRAM as an example of an effective semiconductor memory device to which the present invention is applied.

Next, the more practical structure and control method of the DLL circuit of this embodiment will be explained. First, the input buffer circuit 140 has a structure, as illustrated in FIG. 4, where the two differential amplifiers AMP1, AMP2 including a pair of input differential MOSFETs, MOSFET for current source connected to the common source side and a pair of active load MOSFETs connected to the drain side are combined in order to amplify the differential clock signals CLK, /CLK inputted from the external side of chip and output the differential clocks ECKT, ECKB of the CMOS level.

The CKEN is the clock enable signal impressed to the gate terminal of the MOSFET for constant current for controlling operation of the input buffer circuit 140 by controlling ON/OFF the operating current. Although not particularly restricted, the MOSFET which is turned ON and OFF complementarily with MOSFET for the current source when the clock enable signal CKEN is applied similarly to the gate terminal to fix an output potential when a current is OFF is connected in parallel to the load MOSFET in the output node side. Here, the two differential amplifying circuits AMP1, AMP2 are combined in parallel because it is required to make equal the delays of signals in the truth and false sides of the differential clocks CLK, /CLK by realizing the perfect symmetry of the circuit.

Figure 5:
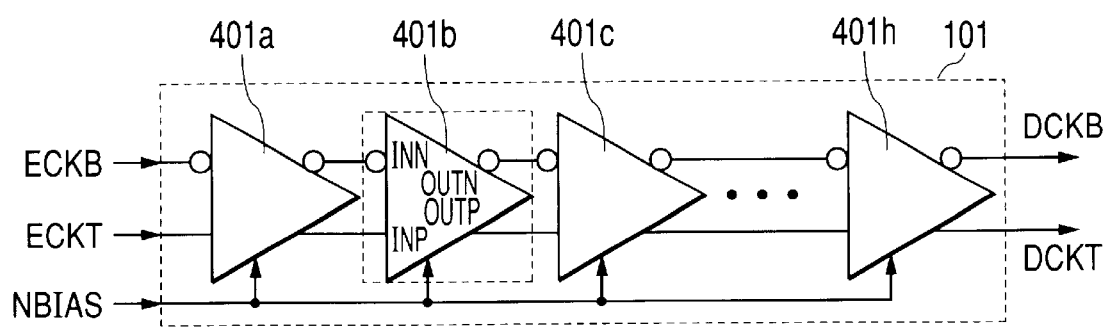
FIG. 5 is a block diagram illustrating a practical example of a variable delay circuit in the DLL circuit of the embodiment.
Figure 6:
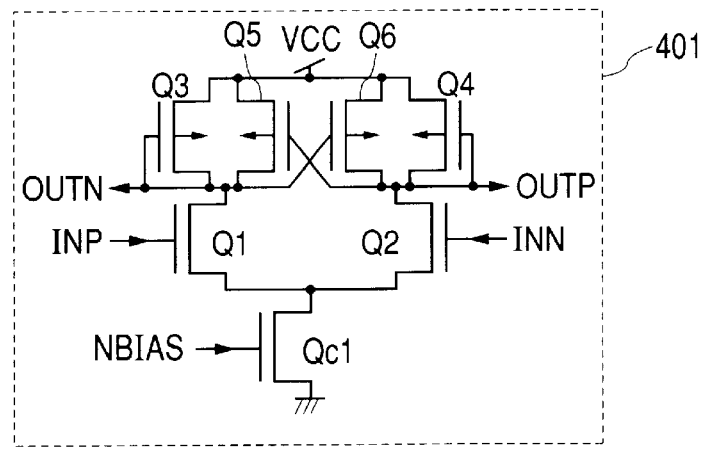
FIG. 6 is a circuit diagram illustrating a practical example of the variable delay element forming the variable delay circuit in the DLL circuit of the embodiment.

As illustrated in FIG. 5, the variable delay circuit 101 is comprised of eight variable delay elements 401a to 401h connected in series and each variable delay element 401a to 401h is comprised of a differential inverter INV as illustrated in FIG. 6.

The differential inverter as the variable delay elements 401a to 401h is provided with a circuit structure similar to the ordinary differential amplifying circuit and is controlled through application of the bias voltage NBIAS to the gate terminal of the MOFET Qc1 for current source from the bias circuit 108 (refer to FIG. 1). Moreover, since the drain side of the input differential MOSFETs Q1, Q2 is provided with a load where the MOSFETs Q3, Q4 of the gate/drain coupling and the MOSFETs Q5, Q6 where the output nodes are cross-connected to the gate terminal are connected in parallel, the symmetry of the circuit is assured and signal delay in the truth and false sides becomes identical with each other.

In the variable delay elements 401a to 401h constituted as explained above, since an operation current of differential inverter is changed with the potential of bias voltage NBIAS, amount of delay until the signal is outputted from it is inputted changes depending on the amplitude of such current value. In more practical, when potential of the bias voltage NBIAS rises, amount of delay is reduced and when this potential falls, amount of delay is increased. Moreover, the variable delay elements 401a to 401h provides a merit that its output is a small amplitude differential signal, power consumption is rather small and delay time is stable for variation of the power supply voltage.

Figure 7:
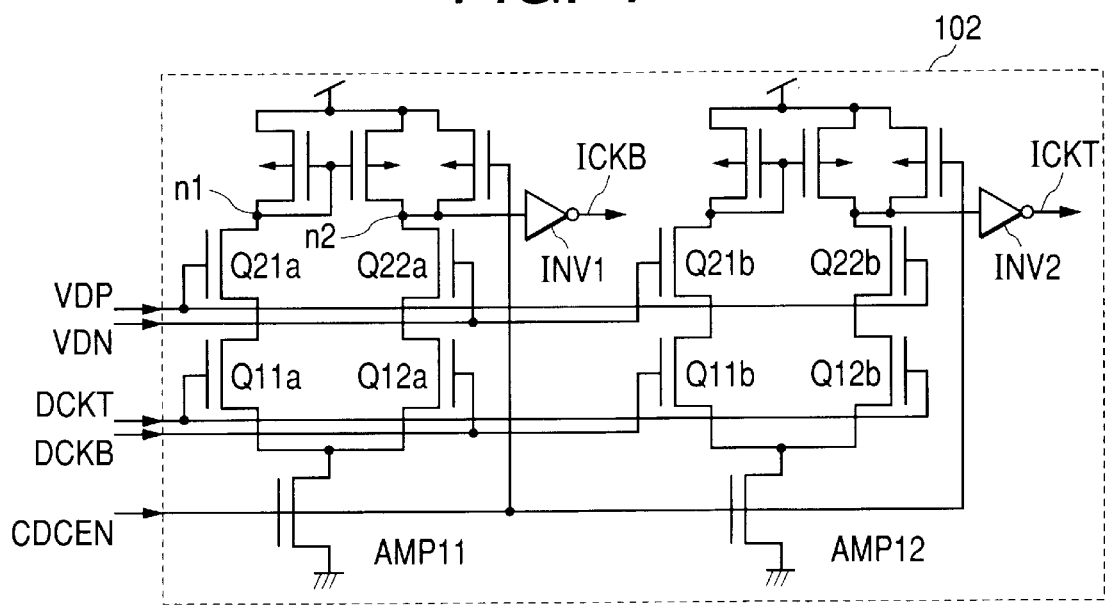
FIG. 7 is a circuit diagram illustrating a practical example of the duty adjusting circuit in the DLL circuit of the embodiment.

FIG. 7 illustrates a practical circuit structure example of the duty adjusting circuit 102. As illustrated in FIG. 7, the duty adjusting circuit 102 is provided with a circuit structure similar to the input buffer circuit 140 illustrated in FIG. 4 in which two differential amplifying circuits AMP11, AMP12 are connected in parallel. Moreover, each differential amplifying circuit AMP11, AMP12 has a structure that the MOSFETs Q21a, Q22a; Q21b, Q22b are connected in series between the drain terminals of the input differential MOSFETs Q11a, Q12a; Q11b, Q12b where the differential clock signals DCKT, DCKB from the variable delay circuit 101 are applied to the gate terminal and an active load. Moreover, the voltages VDP, VDN from the charge pump 107 for generating a voltage depending on the phase difference detected with the phase frequency comparator 105 are respectively applied to the gate terminals of these MOSFETs Q11a, Q12a; Q11b, Q12b and these MOSFETs function as the variable resistance elements which change its resistance values depending on the voltages VDP, VDN.

When the clock signals DCKT, DCKB are inputted to the duty adjusting circuit 102 of this embodiment from the variable delay circuit 101, these signals are amplified to the signals of the CMOS level and the duty of the output clock signals ICKT, ICKB are adjusted because the rising time and falling time of the output signals are changed depending on the voltages VDP, VDN with the effects of the MOSFETs Q21a, Q22a; Q21b, Q22b.

Figure 8:
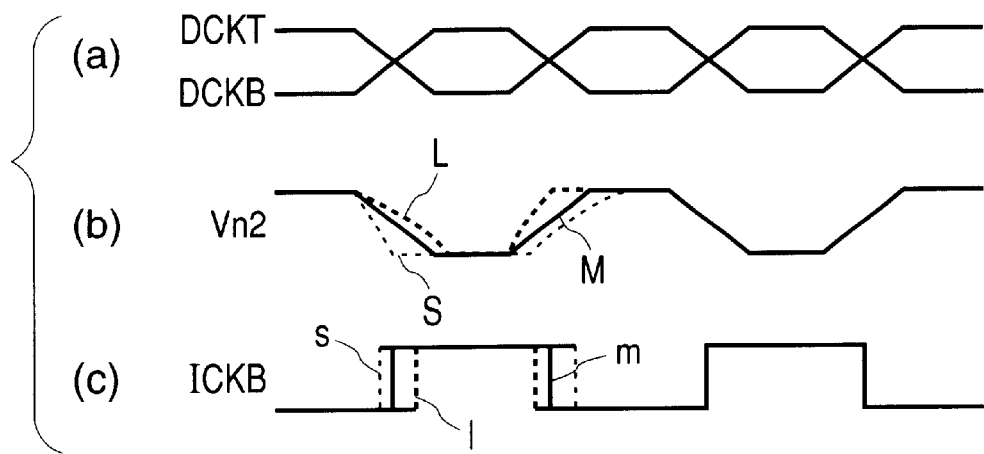
FIGS. 8A to 8C are waveform diagrams illustrating the operation of the duty adjusting circuit.

In order to explain this operation in more detail, it is considered that the voltages VDP and VDN are equal by placing importance to the differential amplifying circuit AMP11. In this case, the ON resistances of the MOSFETs Q21a, Q22a are equal and these resistances work as the load resistance of the equal value for the MOSFETs Q11a, Q12a. Therefore, it is also assumed that the clocks DCKT, DCKB having the duty of 50% as illustrated in FIG. 8A are inputted. In this case, the potential Vn2 of the output node n2 in the positive phase side shows the almost equal rising time and falling time as indicated with a solid line M of FIG. 8B and the output clock ICKT obtained by inverting above clock signals with the inverter INV1 is outputted in direct as the clock having the duty of 50% as indicated with a solid line m of FIG. 8C.

Here, when it is also considered that the voltage VDP becomes higher than VDN, the ON resistances of these MOSFETs Q21a, Q22b are reduced and the ON resistances of Q21b, Q22a are increased. Thereby, a load of the MOSFET Q11a is reduced and a load of the MOSFET Q12a is increased. As a result, the potential Vn2 of the output node n2 in the positive phase side rises quickly with the effect of active load as indicated with a broken line L of FIG. 8B resulting in the short rising time and also falls slowly with increase of resistance value of Q12a resulting in the long falling time. Thereby, the output clock ICKB obtained by inverting the potential Vn2 of the output node n2 with the inverter INV1 can be outputted as the clock having the duty smaller than 50% as indicated with a broken line 1 of FIG. 8C. Because of symmetry of the circuit, ICKT is outputted as the clock having the duty of 50% or more.

On the other hand, when it is considered that the voltage VDP becomes smaller than VDN, the ON resistances of the MOSFETs Q21a, Q22b increase and ON resistances of Q21b, Q21a reduce. Thereby, a load of the MOSFET Q11a increases, while a load of Q12a decreases and accordingly the potential Vn2 of the output node n2 in the positive phase side rises slowly due to the effect of the active load as indicated with a broken line S of FIG. 8B resulting in longer rising time, while this potential quickly falls due to reduction of resistance value of Q12a resulting in shorter falling time. Accordingly, the clock ICKB obtained by inverting the potential Vn2 of the output node n2 with the inverter INV1 is outputted as the clock having the duty of 60% or more as indicated with a broken line S of FIG. 8C. Because of symmetry of the circuit, the clock ICKT is outputted as the clock having the duty of 50% or less.

The clocks ICKT, ICKB outputted from the duty adjusting circuit 101 are outputted to the outside of DLL and also inputted to the replica delay circuit 103. As explained above, the replica delay circuit 103 gives the predetermined delay (t1+t3) corresponding to the sum of delay t1 of the input buffer 140 and delay t3 of the output circuit 120 to the input clocks ICKT, ICKB. The accuracy of delay of the replica delay circuit 103 must be high because it is related in direct to the accuracy of the data output phase. Therefore, various circuit formats have already been proposed. In the present embodiment, the replica circuit which has been used in the related art is also used. Therefore, detail explanation of this circuit will be omitted here. In short, the replica delay circuit 103 can provide the predetermined amount of delay (t1+t3) by introducing the structure that the circuit of the same structure as the input buffer 140 and the circuit of the same structure as the output circuit 120 are connected in series.

The clock RCKT delayed with the replica delay circuit 103 is frequency-divided to ½ with the frequency-dividing circuit 110 to become the clock RCKT2. Moreover, the clock ECKT fetched with the input buffer 140 is also frequency-divided to ½ with the frequency-dividing circuit 109 to become the clock ECKT2. As explained previously, harmonic lock can be prevented by the frequency-division of the clocks ECKT and RCKT with the frequency-dividing circuits 109 and 110. These frequency-dividing circuits 109, 110 are similar to the well-known frequency-dividing circuit and these are formed respectively with the flip-flop circuits where the negative phase side output, for example, is fed back as the input to the data terminal to execute the latch operation at the rising edge of the clock. Thereby, the signals obtained by frequency-division to ½ of the clocks RCKT, ECKT can be outputted from the positive phase side output terminal.

Figure 9:
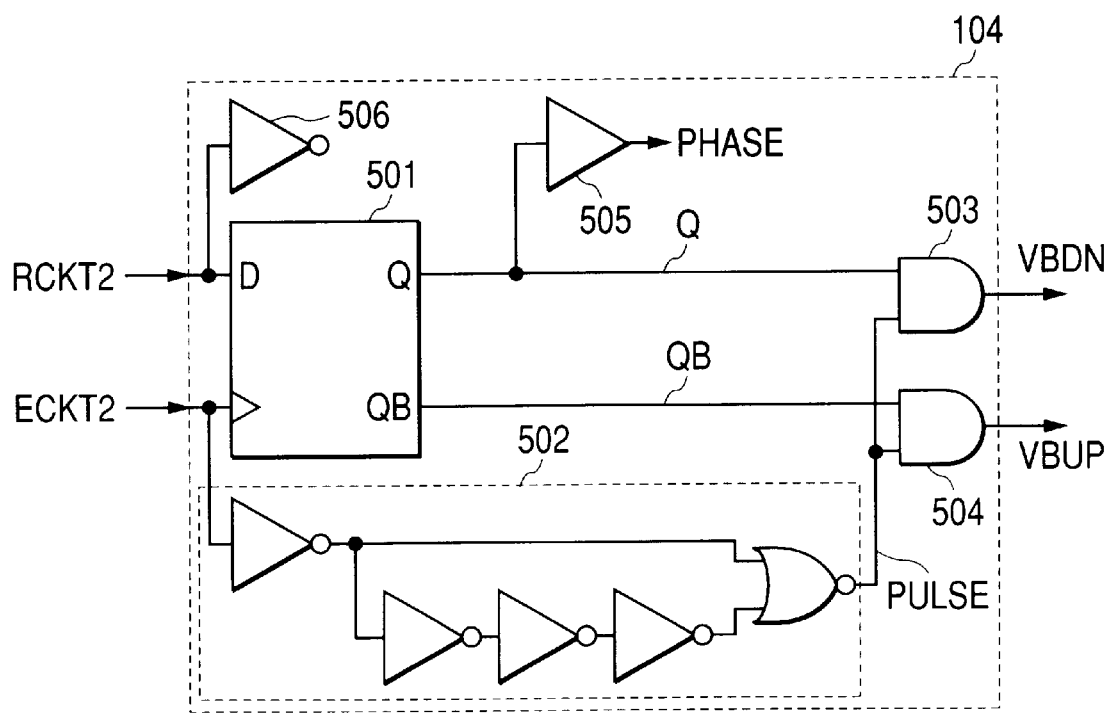
FIG. 9 is a block diagram illustrating a practical example of the phase comparator in the DLL circuit of the embodiment.

FIG. 9 illustrates a practical example of the phase comparator 104 for phase comparison of the clocks ECKT2 and RCKT2 frequency-divided with the frequency-dividing circuits 109, 110. The phase comparator 104 is comprised of a flip-flop circuit 501 where the clock RCKT2 is inputted to the data terminal while the clock ECKT2 is inputted to the clock terminal, a one-shot pulse generation circuit 502 for generating the pulse for each rise of the clock ECKT2 and a couple of AND gate circuits 503, 504 for receiving the outputs Q, QB of the positive phase and negative phase of the flip-flop 501 at the one input terminal and also receiving in common the output pulse PULSE of the one-shot pulse generation circuit 502 at the other input terminal.

In the phase comparator 104 of this embodiment, when the rising edge of the clock RCKT2 is inputted preceding the rising edge of the clock ECKT2, as illustrated in FIGS. 3C and 3E, the output Q of the flip-flop 501 is set to the high level and the inverted output QB is set to the low level and these are outputted with the output pulse PULSE of the one-shot pulse generation circuit 502. Thereby, as illustrated in FIG. 3F, the pulse is formed as the output signal VBDN indicating the lead phase and is then outputted. On the other hand, when the rising edge of the clock RCKT2 is inputted after the rising edge of the clock ECKT2, the output Q of the flip-flop 501 is set to the low level, while the inverted output QB to the high level, and these outputs are outputted with the output pulse PULSE of the one-shot pulse generation circuit 502. Thereby, as illustrated in FIG. 3G, the pulse is formed as the output signal VBUP indicating delay of phase and is then outputted. Namely, the output signal VBDN or VBUP is outputted depending on the preceding phase of the clocks ECKT2 and RCKT2.

Moreover, the output Q of the flip-flop 501 is supplied to the DLL control circuit 111 via the buffer 505 as the signal PHASE indicating the lead/delay phase. Thereby, the DLL control circuit 111 can detect the lead phase of the clocks ECKT2 and RCKT2. The inverter 506 connected to the data input terminal side of the flip-flop 501 is a dummy circuit for equalizing the signal transfer delay time by equally sharing the load in the input side of clock ECKT2 and the input side of clock RCKT2.

Figure 10:
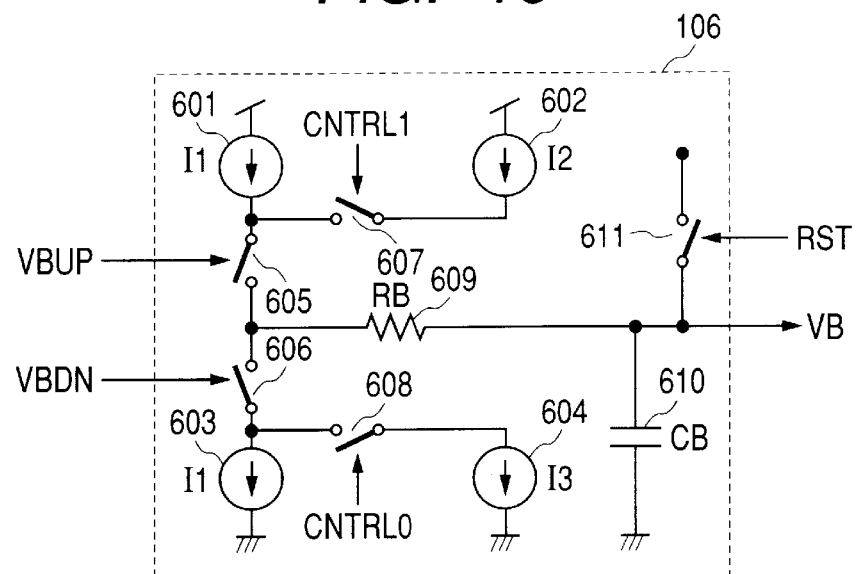
FIG. 10 is a circuit diagram illustrating a practical example of the first charge pump circuit 104 in the DLL circuit of the embodiment.

The pulse signals VBUP, VBDN outputted from the phase comparator 104 are inputted to the charge pump circuit 106 and the output voltage VB changes depending on the preceding phase of the clocks ECKT2 and RCKT2. As illustrated in FIG. 10, the charge pump circuit 106 is comprised of four current sources 601 to 604, four MOS switches 605 to 608 and a low-pass filter consisting of the resistor 609 and capacitor 610.

Here, when the UP signal pulse VBUP is inputted to the charge pump circuit 106, the MOS switch 605 becomes conductive. Thereby, a current I1 from the current source 601 is supplied to the filter to charge the capacitor 610, allowing the potential of the output voltage VB to rise. On the other hand, when the DOWN signal pulse VBDN is inputted, the MOS switch 606 becomes conductive. Thereby, charges are go out of the capacitor 610 with the current I3 of the current source 603, causing the potential of the output voltage VB to drop.

The phase comparator 106 of this embodiment is provided with the current sources 602 and 604 in parallel with the current sources 601 and 603 and with the MOS switches 607 and 608 between the current source 602 and capacitor 610 and between the capacitor 610 and current source 604. These MOS switches 607 and 608 are controlled with the control signals CNTRL0, CNTRL1 from the DLL control circuit 111 but these are set in the OFF condition during the ordinary control period, giving no influence on the operation of the charge pump 106. The MOS switches 607 and 608 are provided to be set to the ON condition during the quick control period where the DLL circuit starts the operation and to assure quick shift to the phase lock condition by improving the charging/discharging rate of the capacitor 610.

Moreover, the charge pump circuit 106 of this embodiment is also provided with a reset switch 611 which is connected between the power source voltage terminal VCC and capacitor 610 and is controlled for ON/OFF condition with the reset signal RST supplied from the control logic of SDRAM when the DLL circuit starts the operations. Thereby, this charge pump circuit 106 starts the operation after the output voltage is once increased to VCC.

Figures 11A, 11B:
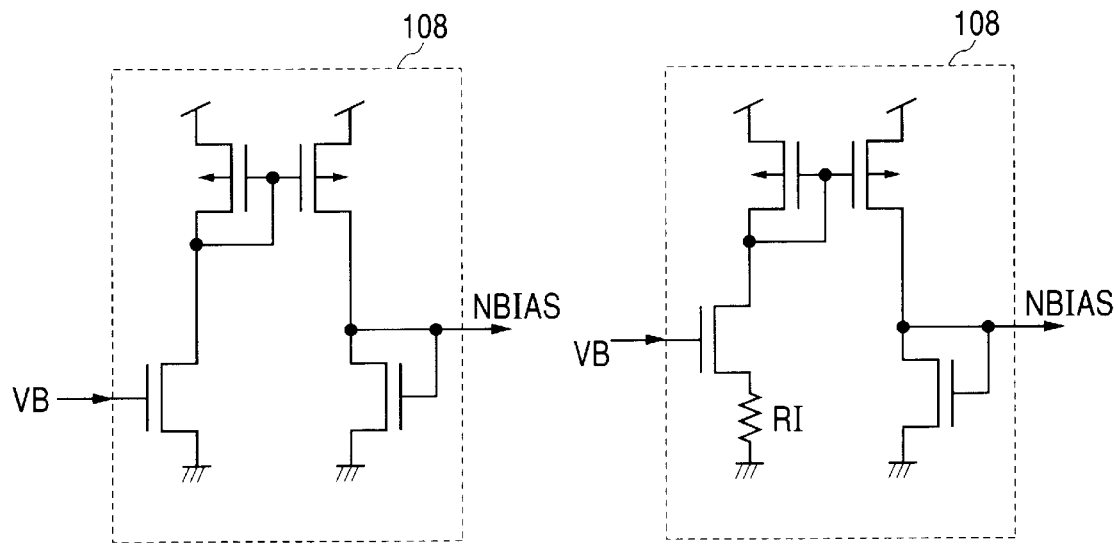
FIGS. 11A, 11B are circuit diagrams illustrating a practical example of the current Miller type bias circuit in the DLL circuit of the embodiment.

The voltage VB generated with the charge pump 106 is supplied to a bias circuit 108 consisting of the current Miller circuit illustrated in FIGS. 11A, 11B and the current flowing into the variable delay elements of the variable delay circuit 101 is controlled with the output current of this bias circuit 108 and the delay time of each delay element is determined with amplitude of this current.

In the bias circuit 108 illustrated in FIG. 11A, a simplified current Miller circuit is used, but the delay control characteristic of the variable delay circuit 101 can also be adjusted by utilizing the bias circuit 108 of the structure illustrated in FIG. 11B. In more practical, the bias circuit of FIG. 11A has the input voltage VB—output current characteristic expressed with a quadratic function, but since the current generated with the input voltage VB and output voltage NBIAS is expressed with a linear function in the circuit illustrated in FIG. 11B, the voltage—delay control characteristic becomes more linear than that of FIG. 11A.

Figure 12:
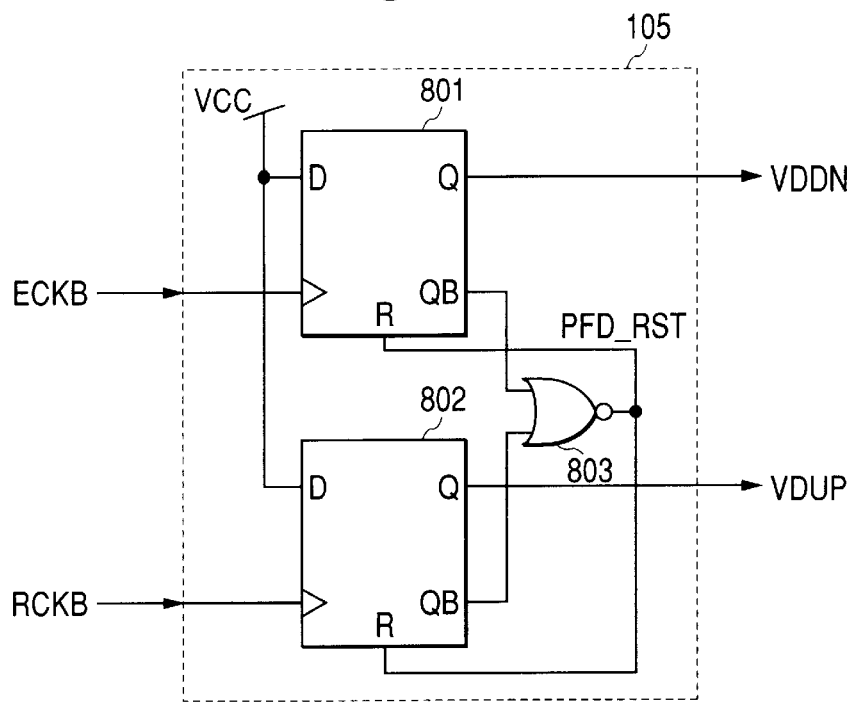
FIG. 12 is a block diagram illustrating a practical example of the phase frequency comparator in the DLL circuit of the embodiment.

FIG. 12 illustrates a practical example of the phase frequency comparator 105 for comparing the phase of the clock RCKB delayed with the replica delay circuit 103 with the phase of the clock ECKB fetched with the input buffer 140.

The phase frequency detection circuit 105 of this embodiment is comprised of two flip-flop circuits 801, 802 and a NOR gate circuit 803, wherein each data input terminal D is connected to the power source voltage VCC, the clock ECKB fetched with the input buffer 140 and the clock RCKB delayed with the replica delay circuit 103 are respectively inputted to the clock terminal and the high level signal is fetched from the data input terminal in synchronization with the rising edge of the clock. Moreover, the flip-flop circuits 501, 502 are constituted to have the asynchronous reset terminal R, whereby the output of the NOR gate circuit 503 inputting the inverted output QB of the flip-flop circuits 501, 502 is inputted as the reset signal. When the reset terminal is set to the high level, the Q output is immediately reset to the low level without relation to the input lock condition, while the QB output to the high level.

In the phase frequency detection circuit 105, when the rising edge of the clock ECKB is inputted preceding the rising edge of the clock RCKB as illustrated in FIGS. 3H, 3I, the output Q of the flip-flop 501 is set to the high level, while the inverted output QB to the low level and thereby the output signal VDDN indicating the lead phase is changed to the high level as illustrated in FIG. 3J. Next, when the rising edge of the clock RCKB is inputted, the output Q of the flip-flop 502 is set to the high level, while the inverted output QB to the low level. When both inverted outputs QB of the flip-flop circuits 501, 502 are set to the low level, the signal PFD_RST as the output of the NOR gate circuit 503 is immediately changed to the high level. The signal PFD_RST is inputted to the reset terminal of the flop—flop circuits 501, 502 and thereby the output Q is immediately changed to the low level. Accordingly, as illustrated in FIGS. 3J, 3K, a longer pulse appears as the output signal VDDN, while a shorter pulse as the output signal VDUP. On the contrary, when the rising edge of RCKB is inputted more quickly than the rising edge of ECKB, a shorter pulse appears as the output signal VDDN, while a longer pulse as the output VDUP. These signals VDDN, VDUP are supplied to the charge pump circuit 107.

Figure 13:
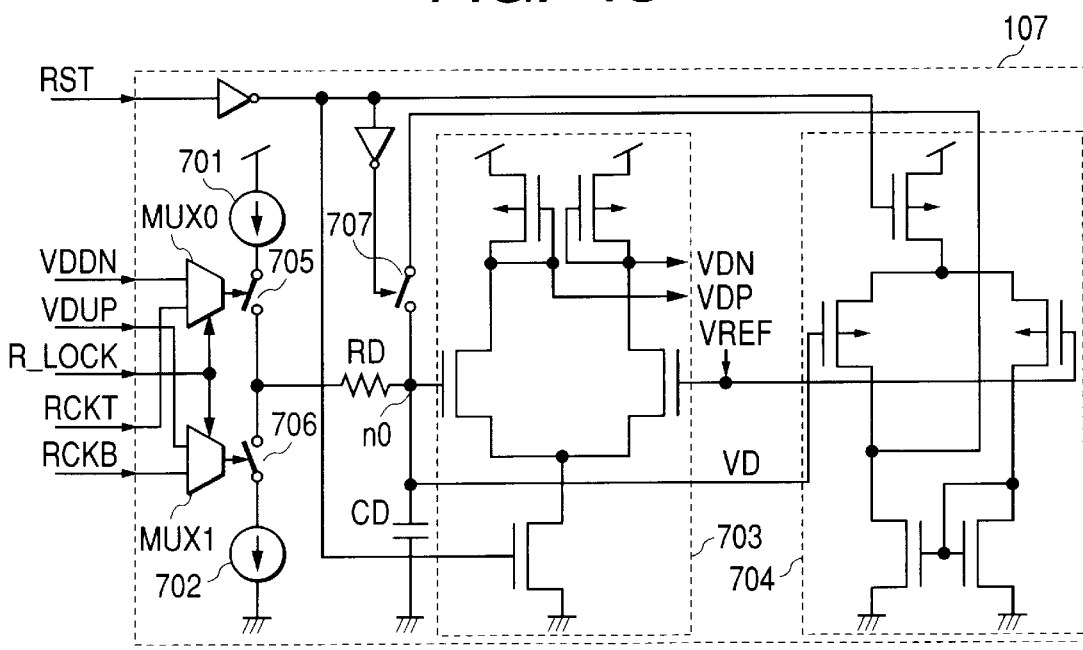
FIG. 13 is a circuit diagram illustrating a practical example of the second charge pump circuit 107 in the DLL circuit of the embodiment.

FIG. 13 illustrates a practical circuit example of the charge pump circuit 107. The charge pump circuit 107 of this embodiment is provided with a resistor RD and a capacitor CD forming a low-pass filter, constant current sources 701, 702 and switch elements 705, 706 for charging and discharging the capacitor CD and a reset switch 707, while the multiplexers MUX0, MUX1 in the input side and an output amplifier 703 consisting of the differential amplifying circuit and a voltage follower circuit 704 to generate the initial voltage 704 in the output side.

The multiplexers MUX0, MUX1 select the signals VDUP, VDDN indicating phase difference supplied from the phase frequency comparator 105 when the control signal R_LOCK supplied from the DLL control circuit 111 is in the high level and select the clocks RCKT, RCKB supplied from the replica delay circuit 103 when the control signal R_LOCK is in the low level and then inputs these selected signals to the MOS switches 705, 706. The MOS switch 705 supplies, when the signal inputted to the gate terminal is high, the current I1 of the current source 701 to the capacitor CD via the resistor RD to charge the capacitor and raise the potential VD of the node n0. On the contrary, when the input to the MOS switch 706 is high, a charging current is extracted from the capacitor CD via the resistor RD with a current I2 of the current source 702 to fall the potential VD of the node n0.

The potential VD of the node n0 is compared with the reference voltage VREF and a potential difference is amplified with a differential amplifying circuit 703 to output the differential signals VDP, VDN. The reference voltage VREF is the reference voltage generated with the reference voltage generation circuit provided within the DDR SDRAM mounting the DLL circuit of this embodiment, although it is omitted in FIG. 1. Moreover, since it is preferable that the potential VD of the node n0 when the charge pump operation starts the operation is almost equal to the potential of reference voltage VREF, the voltage follower circuit 704 is activated with the reset signal RST before start of operation of the DLL circuit and the reset switch 707 is turned ON simultaneously. Thereby, the potential VD of the node n0 is equalized to the reference voltage VREF.

The reason why the differential amplifying circuit using NMOS is used as an output amplifier 703 is that the reference voltage VREF is generated and supplied to stabilize the potential with reference to the substrate potential VSS and it is desirable that the output VDP and VDN of the charge pump circuit 107 are set to the values comparatively near to the power supply voltage VCC from the characteristic of the duty adjusting circuit 102. Meanwhile, the reason why the voltage follower circuit 704 is comprised of the differential amplifying circuit using PMOS is that the differential amplifying circuit using PMOS has the amplifying coefficient which is higher than that of the differential amplifying circuit using NMOS and assures more excellent performance as the voltage follower circuit.

Above is the explanation about the structure of the DLL circuit of this embodiment and the control method of the DLL circuit of this embodiment will then be explained below.

In the DLL circuit of this embodiment, the phase control for the rising edge of the clock is conducted. In more practical, at the time of starting the control, the control signal R_LOCK outputted from the DLL control circuit 111 is set to the low level, while the charge pump circuit 107 selects the clocks RCKT, RCKB supplied from the replica delay circuit 103 to operate. Thereby, the duty adjusting circuit 12 operates to set the duty of the clocks ICKT, ICKB to 50%. It is because if the duty is deviated from 50%, the variable delay circuit 101 of the system as illustrated in FIG. 5 and FIG. 6, the delay effect for the rising edge and falling edge of the clock is different and amount of delay cannot be set accurately. This duty adjusting operation will be explained later in detail.

In the phase control of the rising edge of clock, when the phase of clock RCKT2 inputted to the phase comparator 104 leads the phase of the clock ECKT2, the VBDN pulse is outputted and the potential of the bias voltage VB becomes lower to control the delay of variable delay circuit 101 to increase and the phase of clock RCKT2 to delay. On the other hand, when the phase of clock RCKT2 inputted to the phase comparator 104 is delayed from the phase of ECKT2, the VBUP pulse is outputted and the potential of the bias voltage VB rises. Thereby, the delay of variable delay circuit 101 is controlled to reduce and the phase of clock RCKT2 is also controlled to lead. With such feedback loop, the phases of the clocks ECKT2 and RCKT2 are always adjusted to become equal, the formula 1 can be set up and the data DQ0 to DQ15 where the phases of the input clocks CLK, /CLK are matched can be outputted.

Moreover, in the DLL circuit of this embodiment, the lock-in control of three stages is conducted to shorten the period until the lock of the phase of rising edge from the start of the operation of DLL circuit. Hereinafter, the lock-in control of three stages will be explained below. First, after the DLL circuit starts the operation, the output voltage VB is reset to the power supply voltage VCC because the reset switch 611 of the charge pump circuit 106 is turned ON with the reset signal RST. Moreover, the control signals CNTRL0, CNTRL1 for adjusting the amount of current of the charge pump circuit 106 are reset to the high level.

Figure 14:
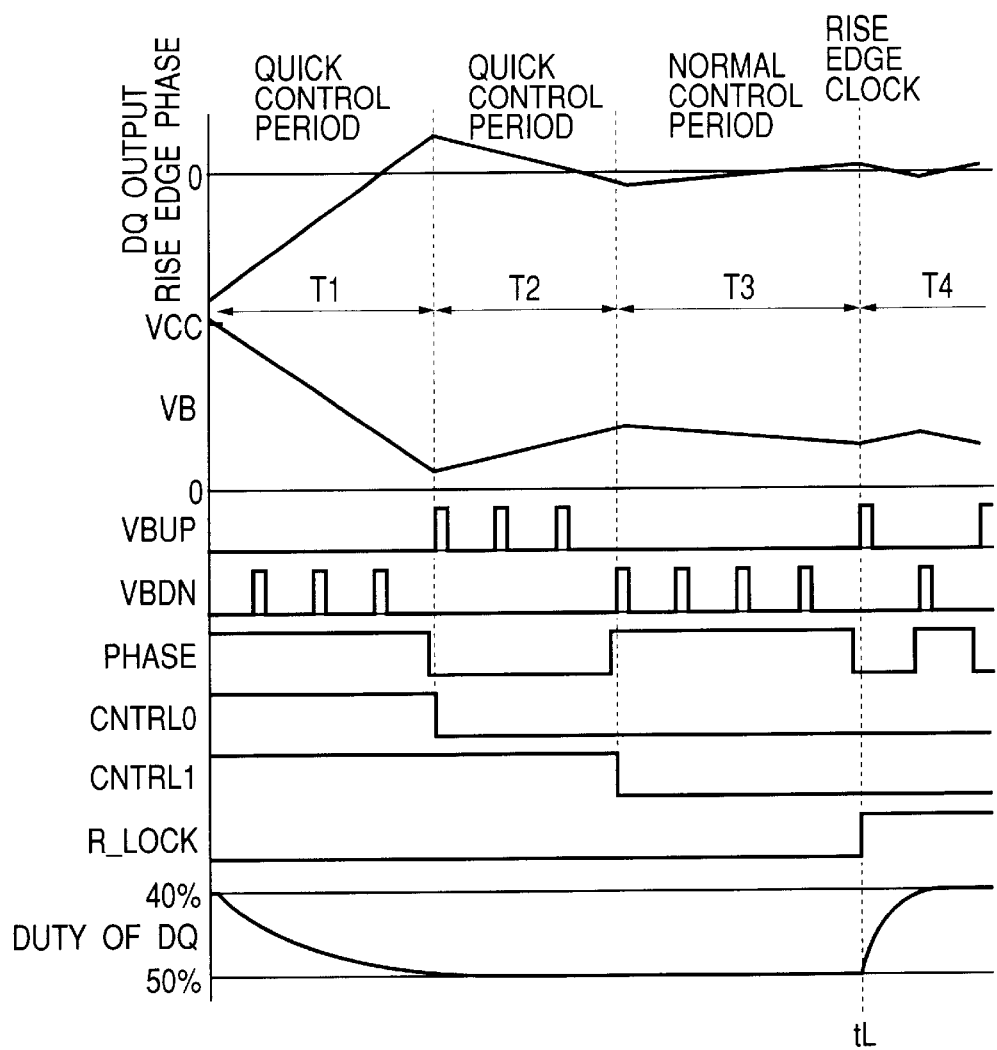
FIG. 14 is a timing diagram indicating transition of each signal until the DLL circuit of the embodiment is phase locked.

When the output voltage VB of the charge pump circuit 106 is set equal to VCC as explained above, delay of the variable delay circuit 101 is minimized. In this case, the phase of rising edge of the output data DQ after the start of the operation of DLL circuit becomes the lead phase (graph indicates a negative value and also indicates the lead phase) as illustrated in FIG. 14. If the phase of data is delayed (positive value) after the start of the operation of DLL circuit, the period (tCK) of the clocks CLK, /CLK becomes too small to lock the DLL circuit. Here, the explanation will be made under the precondition that the DQ output after the start of the operation of DLL circuit has the lead phase.

When the output data DQ immediately after the start of the operation of DLL circuit has the lead phase, as a result of phase comparison of the phase comparator 104, the signal PHASE is outputted to the DLL control circuit 111 as the high level and the pulse signal VBDN is also outputted to the charge pump circuit 106. In this case, since the control signal CNTRL0 supplied to the charge pump circuit 106 from the DLL control circuit 11 is set to the high level, a charge-down current of the charge pump circuit 10 becomes equal to I1+I3. Thereby, amount of delay of the variable delay circuit 101 is quickly increased and the phase of the output data DQ is also delayed (quick control period T1). Thereafter, when the phase of the output data DQ is delayed, the signal PHASE changes to the low level. Here, the DLL control circuit 111 sets the control signal CNTRL0 for the charge pump circuit 106 to the low level by observing the change of this signal PHASE.

Moreover, the pulse signal VBUP is outputted to the charge pump circuit 106 from the timing where the phase of the output data DQ is delayed. However, since the CNTRL0 becomes low level but the CNTRL1 is kept at the high level, the charge-up current of the charge pump circuit 106 becomes equal to I1+I2. Here, in the charge pump circuit 106 of FIG. 10, the current values of the current sources 601 to 604 are adjusted to provide the relationship I2<I3 and thereby the phase of the output data DQ is controlled in the delaying direction slower than the control in the quick control period T1 (quick control period T2).

Next, when the phase becomes again the lead phase, the signal PHASE becomes high level and the control signal CNTRL1 for the charge pump circuit 106 is changed to the low level. Thereafter, a charge-up current and a charge-down current of the charge pump circuit 106 become equal to I1 and therefore fine control is conducted (general control period T3) to make zero the phase of the output data DQ. When the signal PHASE is first changed to the low level in the general control period, the rising edge of the clock is locked. In this case, the signal R_LOCK outputted from the DLL control circuit 111 is changed to the high level indicating that the rising edge is locked (rising edge lock period T4).

Next, the duty control of clock will be explained. In this embodiment, there exist the mode for controlling the duty of the clocks RCKT, RCKB to 50% and the mode for matching the duty of the clock RCKB with the input clock ECKB. When the signal R_LOCK outputted from the DLL control circuit 111 is set to the low level indicating the non-lock condition, the DLL control circuit 111 controls to set the clocks RCKT, RCKB to the duty of 50%. When the signal R_LOCK is set to the high level indicating the lock condition, the DLL control circuit 111 controls to attain the matching of the duty of clock RCKB with the input clock RCKB.

Figure 15:
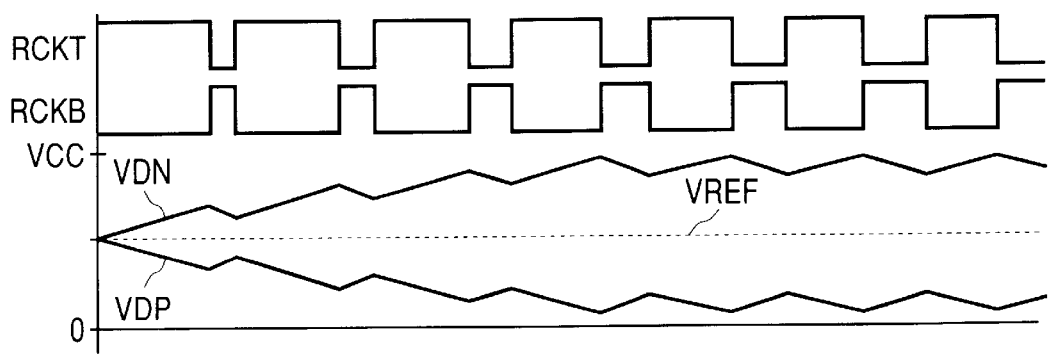
FIG. 15 is a timing diagram indicating operation of the charge pump circuit of FIG. 13.

First, the control for setting the duty of clock to 50% will be explained. Since the signal R_LOCK is in the low level, the multiplexers MUX0, MUX1 of the charge pump 107 of FIG. 13 select the clocks RCKT, RCKB. Here, as illustrated in FIG. 15, when the case where the pulse width of the clock RCKT is wide and the pulse width of the clock RCKB is narrow is considered, when the clock RCKT is in the high level in the charge pump circuit 107, the potential VD of the node n0 rises and on the contrary, when the clock RCKB is in the high level, the potential VD of the node n0 falls. However, since the pulse width of the clock RCKT is wider than the clock RCKB, the potential VD of the node n0 gradually rises as a whole.

Thereby, the output VDN obtained by amplifying the potential VD of the node n0 with the differential amplifying circuit 703 rises, while VDP falls. When these VDN, VDP are supplied to the duty adjusting circuit 102 of FIG. 7, the pulse width of the clocks ICKT, RCKT is reduced, the pulse width of the clocks ICKB, RCKB is increased and the output potentials VDN, VDP of the charge pump circuit 107 are balanced when the duty of the clocks RCKT, RCGKB becomes 50%. On the contrary, when the pulse width of the clock RCKT is narrow, while the pulse width of RCKB is wide, the output voltage VDN of the charge pump circuit 107 drops, while VDP rises and these VDN and VDP are balanced when the duty of the clocks RCKT, RCKB becomes 50%. Under the condition that the duty of the clocks RCKT, RCKB is equal to 50%, the phase control is conducted to the rising edge with the feedback loop of the replica delay circuit 103—phase comparator 104—variable delay circuit 101 explained above.

Figure 16A:
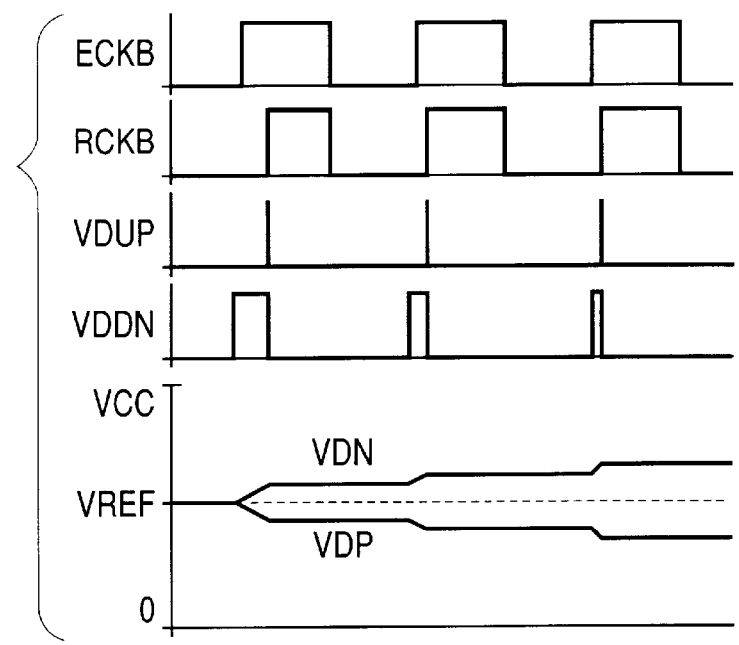
FIGS. 16A and 16B are timing diagrams indicating transition of each signal when the rising edge of the output clock is matched with the falling edge of the input clock in the DLL circuit of the embodiment.

Next, the control for giving the duty to the clock RCKB which is equal to that of ECKB after the phase lock will be explained with reference to FIGS. 16A, 16B. FIG. 16A corresponds to the case where the rising edge of the clock RCKB is delayed, while FIG. 16B corresponds to the case where the riding edge of the clock RCKB is leading. Since the phase matching of the rising edge of the clock RCKT and falling edge of the RCKB is completed before starting the duty control, the rising edges of the clocks RCKB and ECKB are matched in the FIGS. 16A and 16B.

As explained above, since the phases of the rising edges of the input ECKT and RCKT are matched with each other, when the duty of the input clock RCKT is matched with the duty of RCKT, the phases of the riding edges of the RCKB and ECKB must be matched with each other. However, in the variable delay circuit 101 of the structure illustrated in FIG. 5 and FIG. 6, the duties of the output clocks RCKT, RCKB are changed for the duties of the input clocks ECKT, ECKB with imbalance of internal load and current driving force and thereby the phases of the rising edges of the clocks RCKB and ECKB are not matched in some cases. FIGS. 16A, 16B illustrate such conditions.

As explained above, since the signal R_LOCK is set to the high level in the phase lock condition, the charge pump circuit 107 of FIG. 13 selects the outputs VDUP, VDDN of the phase frequency comparator 105 as the input signal. On the other hand, when the rising edges of the clocks RCKB and ECKB are not matched with each other as explained above, the VDDN signal or VDUP signal having the duration equal to the phase difference of both clocks is outputted from the phase frequency comparator 105 as illustrated in FIGS. 16A and 16B. These VDDN, VDUP signals are supplied to the charge pump circuit 107. When the rising edge of the clock ECKB appears quickly as illustrated in FIG. 16A, the signal VDDN outputted together with VDUP from the phase frequency comparator 105 is larger than the signal VDUP, the potential of the output VDP of the charge pump circuit 107 drops and the potential of signal VDN rises.

Thereby, the duty adjusting circuit 102 of FIG. 7 increases the pulse width of the clock ICKT and reduces the pulse width of the clock ICKB. As a result, the duty of the clocks ICKT, ICKB becomes close to the duty of the clocks RCKB, ECKB in the input side. When this control is repeated for several times, the rising edge of the clock RCKB is matched with the rising edge of the clock ECKB.

Figure 16B:
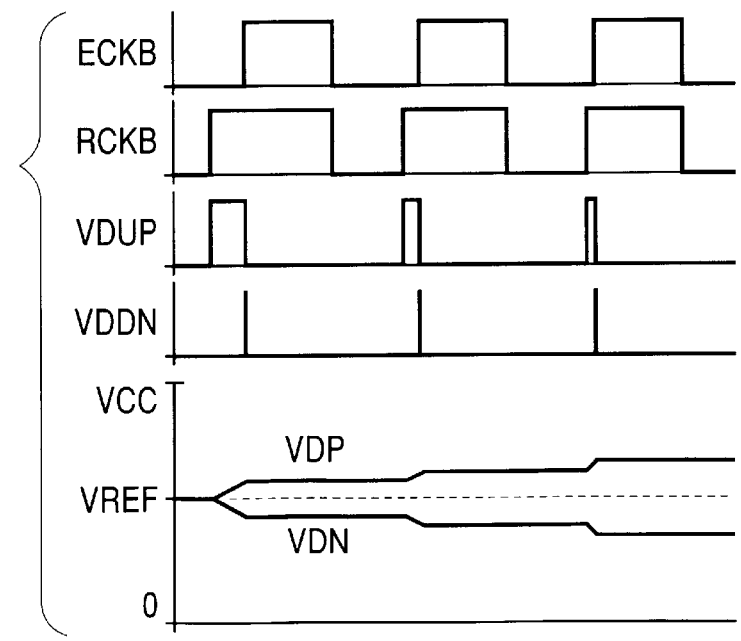

On the contrary, when the rising edge of the clock appears first quickly as illustrated in FIG. 16B, since the signal VDDN which is outputted together with the signal VDUP from the phase frequency comparator 105 is larger than VDUP, the potential of the output VDP of the charge pump circuit 107 rises and the potential of VDN drops. Thereby, the pulse width of the clock ICKT is reduced and the pulse width of ICKB is increased.

As a result, the duty of the clocks ICKT, ICKB is set close to the duty of the clocks RCKB, ECKB in the input side. When this control is repeated for several times, the rising edge of the clock RCKB is matched with the rising edge of the clock ECKB. When the rising edges of the clocks RCKB and ECKB are matched with each other, the pulse width of the pulses VDUP and VDDN is extremely narrowed and the pulse width becomes identical each other. Under this condition, the duty control is balanced and the condition where the rising edges of the clocks RCKB and ECKB are matched with each other is maintained. Even during this duty control period, the rising edge of the input clock ECKB is matched with the rising edge of the clock RCKB with the delay control of the variable delay circuit. Therefore, since the rising edge of clock RCKB is matched with the rising edge of ECKB, it can be concluded that the duties of the clocks ECKB and RCKB are matched with each other.

Next, the relationship between the phase control until the phase lock condition from the start of the phase control in the DLL circuit of this embodiment and the duty control will be explained more practically. Here, the duty of the input clock CKT is assumed as 40%. In this case, the duty of clock of the inverse phase /CLK is of course 60%.

As illustrated in FIG. 14, in the period T1 to T3 until the lock of rising edge from the start of operation of the DLL circuit, the duty of output data DQ is gradually changed to 50% from 40% because the duty control is performed to change the duty of the clocks RCKT, RCKB toward 50%. After the timing tL for the lock of the rising edge, the duty of clock RCKB is controlled to be matched with the duty of ECKB. Therefore, the duty of the output data DQ is quickly changed to duty of 40% of the input clock CLK from 50%.

In the period T1 to T3 until the rising edge is locked, any problem is not generated if the duty control is never executed. However, in the variable delay element 401 of the analog control system as illustrated in FIG. 6, if the delay t2 in the variable delay circuit 101 increases, there rises a worry that delay of the rising edge increases even if the bias voltage NBIAS is lowered but delay of the rising edge does not increase. Therefore, when the cycle time tCK is large, the bias voltage NBIAS sometimes becomes lower exceeding the limit for normally controlling the delay t2. When delay of the rising edge is no longer increased, the phase can no longer be locked at the rising edge, resulting in the fear for disabling the phase control of the rising edge.

However, in this case, if the duty of clock is controlled to 50% as in the case of this embodiment, delay of the rising edge of the output clocks ICKT, ICKB of the duty adjusting circuit 102 may be increased because the delay of the rising edge is increased even if the delay of the rising edge of the output clocks DCKT, DCKB of the variable delay circuit 101 does not increase. Thereby, reduction of phase lock range due to deviation of duty can be prevented by eliminating the condition that the phase control of the rising edge is disabled under the condition of lower bias voltage NBIAS.

Figure 18:
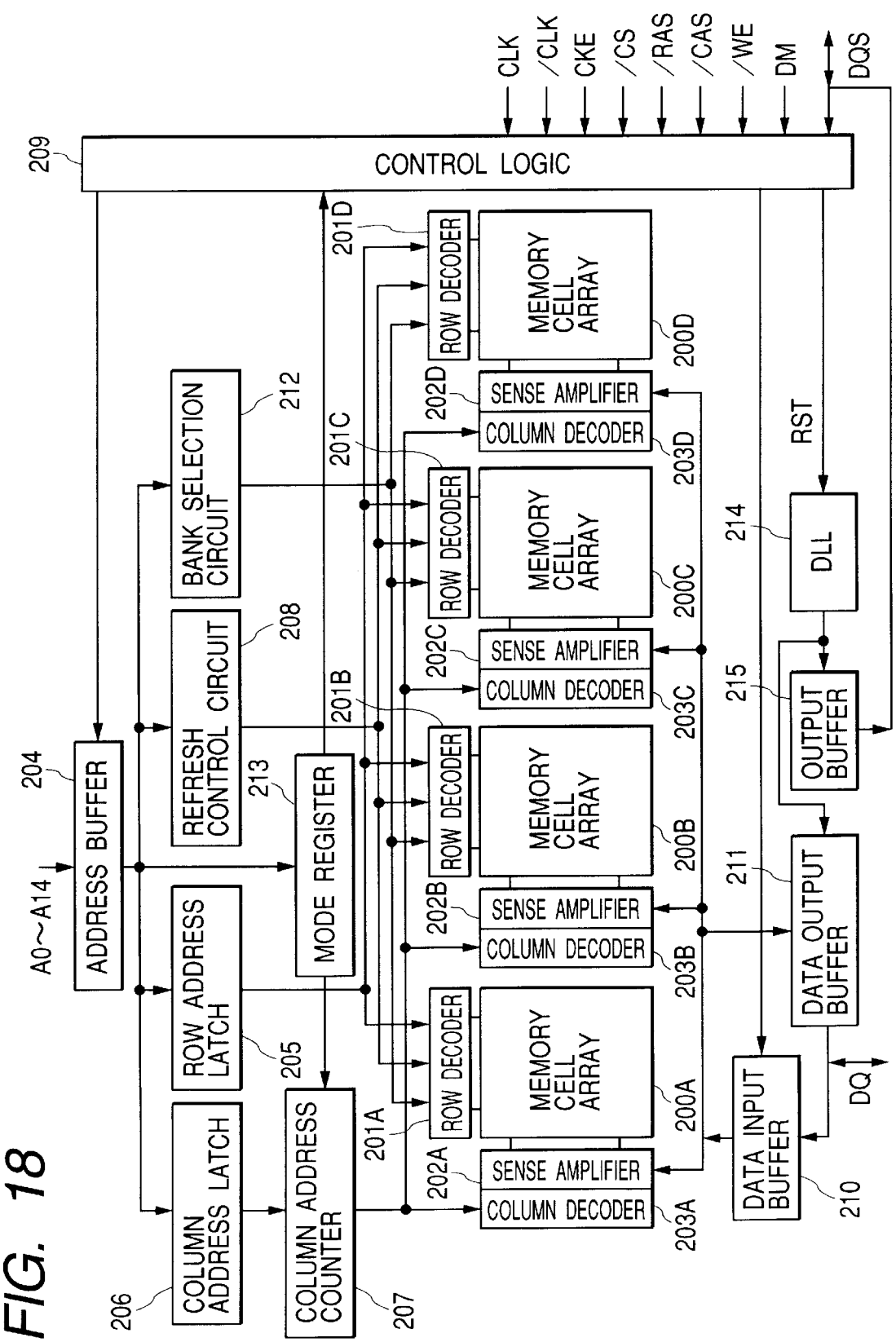
FIG. 18 is a block diagram illustrating an embodiment of the DDR SDRAM using the DLL circuit to which the present invention is applied.

FIG. 18 is a block diagram of the DDR SDRAM mounting the DLL circuit to which the present invention is adapted.

The SDRAM of FIG. 18 comprises memory cell arrays 200A to 200D comprised of four banks, for example, where a plurality of memory cells are arranged like the matrix to have the memory capacity of 256 Mbits in total, an address buffer 204 for fetching the addresses A0 to A14 inputted from the external circuit, a row address latch 205 for latching the row address among the addresses fetched with the address buffer 204, a bank selection circuit 212 for selecting any one of the memory cell arrays 200A to 200D by decoding the bank address among the addresses fetched with the address buffer 204, a column address latch 206 for latching the column address, row address decoders 201A to 201D for selecting the word line in the memory arrays 200A to 200D by decoding the row address, sense amplifying circuits 203A to 203D for amplifying the signal read with the bit line through the selection of the word line, a column address counter 207 for automatically updating, within the circuit, the column address latched with the column address latch 206, column address decoders 203A to 203D for selecting the column (bit line) in the memory arrays 200A to 200D by decoding the column address, a control logic 209 for generating an internal control signal by receiving the control signal such as the chip select signal /CS to be inputted from the external circuit, a data output buffer 211 for outputting, to the external circuit, the data read from the memory cell arrays 200A to 200D, an output buffer 215 of the data strobe signal DQS indicating the timing of data outputted from the output buffer 211, a clock generation circuit 214 consisting of the DLL circuit of the present invention for controlling the timing of the data outputted from the output buffer 211, an input buffer 210 for receiving the data inputted from the external circuit, a refresh control circuit 208 for refreshing the memory cell arrays 200A to 200D based on the control signal inputted from the external circuit, and a mode register 213 for setting the operation mode based on a part of the address signal inputted from the external circuit.

As the control signal inputted to the control logic 209 from external circuits, a pair of clocks CLK, /CLK in the inverse phases, a clock enable signal CKE indicating that the clocks are effective, a row address strobe signal /RAS (hereinafter, referred to as RAS signal), a column address strobe signal /CAS (hereinafter, referred to as CAS signal), a write enable signal /WE instructing the data write operation, a data strobe signal DQS indicating the data input/output timing and a data mask signal DM for inhibiting the data input/output are considered, in addition to the chip select signal /CS for setting the chip to the selection condition. The signals which are given the mark "/" before the sign means that this signal becomes the low level as the effective level. The control logic 209 can maintain the value of CAS latency in the internal register depending on the MRS command for instructing the setting to the mode register among the input commands.

In the DDR SDRAM of this embodiment, the external clocks CLK, /CLK become effective for the control logic 209 when the clock enable CKE signal is high level. Since the internal clock outputted from the DLL circuit is required at the time of the read (READ) operation of the DDR SDRAM, the READ operation of the DDR SDRAM will be explained here.

In the DDR SDRAM and the DRAM employing the address multiplexing, the row address is fetched with an input of the active command ACTV and thereby the memory cell arrays 200A to 200D are set to the active condition. Thereafter, when the read command READ is inputted, the column address is then fetched to select the column.

The DDR SDRAM is divided into four memory cell arrays 200A to 200D in order to enhance the efficiency of the data input/output operation. When the active command ACTV consisting of the combination of the signals of CKE=1, /CS=0, /RAS=0, /CAS=1, /WE=1 are inputted at the cross-point of CLK, /CLK in the rising side of CLK in order to set the memory cell arrays 200A to 200D to the active condition, the address signals A0 to A14 are divided into the bank address signals and row address signals and these signals are fetched respectively with the bank selection circuit 212 and row address latch 206. When the bank corresponding to the bank address signal and the word line corresponding to the row address signal are selected, the data of memory cells connected to the selected word lines are read to the bit line and are amplified with the sense amplifying circuits 202A to 202D and thereafter are maintained.

Subsequently, a column address is designated to read the target data from the sense amplifying circuits 202A to 202D. When the read command READ consisting of combination of the signals CKE=1, /CS=0, /RAS=1, /CAS=0, /WE=1 is inputted at the cross-point of CLK, /CLK in the rising side of CLK, the address signals A0 to A14 are divided to the band address signals and column address signals and these signals are respectively fetched to the bank selection circuit 212 and the column address latch 206. Since /WE=1 is designated, the control logic 209 recognizes the read operation and starts the read operation when the bank designated with the bank address signal is active. The data of the columns selected with the column address decoders 203A to 203D are then read to the data output buffer 211 and are then latched in the timing of the internal clock outputted from the DLL circuit 214. The internal clock outputted from the DLL circuit 214 has the lead phase for the CLK, /CLK as much as the amount of delay in the data output buffer 211 as explained previously and therefore the output data DQ has the same phase as the external clocks CLK, /CLK.

Moreover, the DDR SDRAM holds, in the internal register 213, various operating conditions such as the number of cycles until issuance of the read command READ from issuance of the active command ACTV, the number of cycles until output of data from issuance of the read command READ and ON/OFF of the DLL circuit. There exists the command for re-writing a value of this internal register 213. The DDR SDRAM roughly includes two kinds of internal registers and contents of these registers may be re-written with the MRS (mode register set) command and EMRS (extended mode register set) command. At the cross-point of CLK, /CLK in the rising side of CLK, a combination of signals of CKE=1, /CS=0, /RAS=0, /CAS=0 and /WE=0 is inputted. When a value of the address signal A14 is for example "0" in this case, the MRS command is used and when A14 is "1", the EMRS command is used. Content of register is adequately re-written with an input of the address other than A14.

Figure 17:
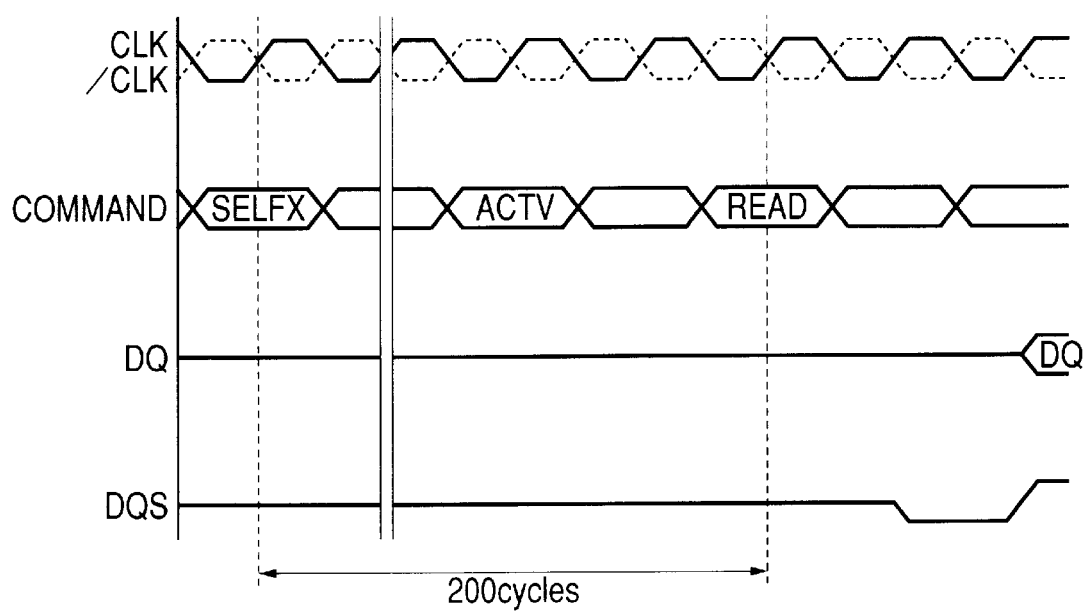
FIG. 17 is a timing diagram for explaining the number of cycles up to the READ command input from the SELFX command input in the SDRAM.

Moreover, immediately after the turning ON of the power source or leaving from the self-refresh condition, the DLL circuit 214 starts the operation in the timing when the mode register setting command MRS or self-refresh end command SELFX is inputted. In this case, with the specification of the DDR SDRAM, it is inhibited to input the READ command during the period of at least 200 cycles from the input of the mode register setting command MRS and self-refresh end command SELFX as illustrated in FIG. 17. Therefore, it is enough when the phase lock operation of the DLL circuit is completed during the period of 200 cycles, the DLL circuit of this embodiment can realize such phase lock operation. Moreover, if the period of clock is changed when the mode register setting command MRS and self-refresh end command SELX are inputted, the phase lock is conducted depending on the period in the SDRAM in which the DLL circuit of this embodiment is mounted. Therefore, in the system including the low power consumption mode of lower clock frequency, the power consumption of the SDRAM mounting the DLL circuit of this embodiment can also be reduced.

The present invention has been explained practically above based on the preferred embodiment, but the present invention is not limited only to above embodiments and naturally allows various changes and modifications without departing from the scope of the claims. For example, the clock duty adjusting circuit is provided immediately after the variable delay circuit but it is also possible to provide such duty adjusting function to the variable delay circuit 101. Moreover, the duty adjusting circuit 102 of the embodiment is constituted as the circuit of the type for amplifying the signals while adjusting the duty of the clocks DCKT, DCKB, but it is also possible to provide such functions independently to form the circuit having structure of the duty adjusting circuit+small signal amplifying circuit.

Moreover, it is also allowed that the signal (for example, VDP, VDN) for controlling the duty of clock is outputted to the external circuit of DLL circuit to execute the duty adjustment with the input buffer circuit 140, output data latch circuit 121 and data output buffer 122. However, on the occasion of conducting the duty adjustment at the outside of the DLL circuit, it is required to also add the duty adjusting function to the replica delay circuit 103. Moreover, when the duty of the clocks ECKT, ECKB is deviated from 50%, it can be thought that the delay control characteristic is deteriorated. Therefore, the variable delay circuit 101 used in this embodiment may be thought to control the duty of the clocks ECKT, ECKB to 50% in the input buffer circuit 140 without relation to the condition of R_LOCK signal and to control, as the application example, the duty of the output data DQ and data strobe signal DQS to become equal to that of the input clock CLK in the DLL circuit.

Moreover, this embodiment is constituted to change the system for controlling the duty depending on the signal R_LOCK by detecting the phase lock of the rising edge using the signal R_LOCK, but if it is difficult in the control to detect the phase lock at the rising edge, it can be thought to introduce the system wherein the circuit is designed so that the rising edge can surely be phase-locked in a certain predetermined period and therefore the duty is controlled to 50% or the duty is not controlled before such period has passed and the control is then executed, after such period has passed, to set the duty of the output data DQ and data strobe signal DQS to become equal to that of the input clock CLK.

Moreover, this system is never limited to the DLL circuit and can also be adapted effectively to the other clock generation circuit for controlling the phase to be matched with the reference clock. For example, it is possible to think about the system in which the duty adjusting circuit is provided to the clock generation circuit using the PLL (Phase Locked Loop), SMD (Synchronous Miller Delay), NDC (Negative Delay Circuit) and BDD (Bi-Directional Delay) circuit and the rising edge is controlled with the PLL, SMD, NDC and BDD circuit, while the falling edge with the duty adjusting circuit. In addition, it is also possible to introduce the system wherein amount of delay is controlled with the falling edge of the clock and the duty is controlled with the rising edge.

The effects of the typical inventions of the present invention can be explained as follows.

Namely, the clock generation circuit to which the present invention is adapted enables high precision phase control at both the rising edge and falling edge of the clock and thereby realizes matching of the duty of the output clock with that of the input clock. Moreover, even under the condition that operations of the variable delay circuit reaches the limitation and thereby delay of the falling edge increases but delay of the rising edge does not increase, the phase lock is possible for the rising edge.

We claim:

1. A clock generation circuit comprising:

an input terminal coupled to receive an input signal;

a variable delay circuit, coupled to said input terminal, provided with a delay time control terminal to give a certain delay to the input signal depending on a delay time control voltage applied to said delay time control terminal and to output a delayed signal;

a duty adjusting circuit, coupled to receive said delayed signal from said variable delay circuit, provided with a duty control terminal to change the pulse width of an output signal of the duty adjusting circuit depending on a duty control voltage applied to said duty control terminal to adjust the duty ratio of said delayed signal;

a fixed delay circuit connected to said duty adjusting circuit for providing an output signal corresponding to the input signal with a predetermined delay relative to the input signal;

a delay time control circuit for generating said delay time control voltage to be applied to the delay time control terminal; and a duty control circuit connected to said fixed delay circuit for generating said duty control voltage, to be applied to the duty control terminal, wherein said delay time control circuit includes: a phase comparison circuit for comparing the phase of the output signal outputted from said fixed delay circuit with the phase of a signal inputted to said variable delay circuit to generate a signal depending on the phase difference; and a delay time control voltage generation circuit for generating said delay time control voltage to be applied to said delay time control terminal based on the signal depending on the phase difference outputted from said phase comparison circuit.

2. A clock generation circuit according to claim 1, wherein said duty adjusting circuit is provided in a subsequent stage side of said variable delay circuit, said fixed delay circuit is provided in a subsequent stage of the duty adjusting circuit, and said duty adjusting circuit changes the pulse width of the output signal of the duty adjusting circuit by substantially equalizing the duty ratio of the output signal outputted from said fixed delay circuit to the duty ratio of the signal inputted to said variable delay circuit.

3. A clock generation circuit according to claim 1, wherein said delay time control circuit compares the phase of the rising edge of the signal inputted to said variable delay circuit with the phase of the rising edge of the output signal outputted from said fixed delay circuit, to generate said delay time control voltage applied to said delay time control terminal corresponding to the phase difference, and wherein said duty control circuit compares the phase of the falling edge of the signal inputted to said variable delay circuit with the phase of the falling edge of the output signal outputted from said fixed delay circuit, to generate said duty control voltage applied to said duty control terminal corresponding to the phase difference.

4. A clock generation circuit according to claim 1, wherein said variable delay circuit is constituted to output an input differential signal by delaying the input signal, wherein the output signal outputted from said fixed delay circuit is also a differential signal, and wherein said duty control circuit is capable of generating said duty control voltage applied to said duty control terminal based on the differential signal outputted from said fixed delay circuit.

5. A clock generation circuit according to claim 1, wherein a phase comparison circuit included in said delay time control circuit is constituted to output the signal indicating the lead phase or delayed phase of two signals to be compared, and is also constituted so that a phase lock determination circuit is provided for determining the phase lock condition based on the signal indicating the leading phase or delayed phase, and wherein said duty control circuit selects, based on the signal indicating the phase lock condition outputted from said phase lock determination circuit, the signal corresponding to the phase difference outputted from a second phase comparison circuit or a differential signal outputted from said fixed delay circuit to generate said duty control voltage applied to said duty control terminal based on the selected signal.

6. A clock generation circuit according to claim 1, wherein said delay time control circuit compares the phase of the falling edge of the signal inputted to said variable delay circuit with the phase of the falling edge of the output signal outputted from said fixed delay circuit, to generate said delay time control voltage applied to said delay time control terminal corresponding to the phase difference, and wherein said duty control circuit compares the phase of the rising edge of the signal inputted to said variable delay circuit with the phase of the rising edge of the output signal outputted from said fixed delay circuit, to generate said duty control voltage applied to said duty control terminal corresponding to the phase difference.

7. A clock generation circuit comprising:

an input terminal coupled to receive an input signal;

a variable delay circuit, coupled to said input terminal, provided with a delay time control terminal to give a certain delay to the input signal depending on a delay time control voltage applied to said delay time control terminal and to output a delayed signal;

a duty adjusting circuit, coupled to receive said delayed signal from said variable delay circuit, provided with a duty control terminal to change the pulse width of an output signal of the duty adjusting circuit depending on a duty control voltage applied to said duty control terminal to adjust the duty ratio of said delayed signal;

a fixed delay circuit connected to said duty adjusting circuit for providing an output signal corresponding to the input signal with a predetermined delay relative to the input signal;

a delay time control circuit for generating said delay time control voltage to be applied to the delay time control terminal; and a duty control circuit connected to said fixed delay circuit for generating said duty control voltage, to be applied to the duty control terminal, wherein said duty control circuit includes:
 a second phase comparison circuit for comparing the phase of a signal at an input side of said variable delay circuit with the phase of the delayed signal at the output side of said variable delay circuit to output a signal corresponding to the phase difference; and
 a second control voltage generation circuit for generating said duty control voltage applied to said duty control terminal based on the phase difference outputted from said second phase comparison circuit.

8. A clock generation circuit comprising:

at least one input terminal coupled to receive an input signal;

at least one output terminal to provide an output of said clock generation circuit;

fixed delay means for providing an output signal corresponding to the input signal signal with a predetermined delay relative to the input signal corresponding to a time period between a time when the signal is inputted to said input terminal until a time when an output signal is outputted from the output terminal;

a variable delay circuit, coupled to said input terminal provided with a delay time control terminal for giving delay to the input signal and outputting a delayed signal corresponding to a delay time control voltage to said delay time control terminal;

a duty adjusting circuit for outputting said output of said clock generation circuit, coupled to receive said delayed signal from said variable delay circuit and coupled to said fixed delay means, provided with a duty control terminal for adjusting a duty ratio by changing the pulse width of the delayed signal inputted corresponding to a duty control voltage to said duty control terminal;

delay time control means for generating said delay time control voltage; and duty control means for generating said duty control voltage, wherein a phase of the delayed signal output from said variable delay circuit based on any one of the rising edge or falling edge of the input signal and thereafter the duty ratio is adjusted with said duty adjusting circuit based on the other edge.

9. A semiconductor integrated circuit device including a delay locked loop circuit comprising:

an input terminal coupled to receive an input signal;

a variable delay circuit, coupled to said input terminal, provided with a delay time control terminal to give a certain delay to the input signal depending on a delay time control voltage applied to said delay time control terminal and to output a delayed signal;

a duty adjusting circuit for outputting an output of said delay locked loop, coupled to receive said delayed signal from said variable delay circuit, provided with a duty control terminal to change the pulse width of an output signal of the duty adjusting circuit depending on a duty control voltage applied to said duty control terminal to adjust the duty ratio of said delayed signal;

a fixed delay circuit providing an output signal corresponding to the input signal with a predetermined delay relative to the input signal;

a delay time control circuit for generating said delay time control voltage to be applied to the delay time control terminal; and a duty control circuit for generating said duty control voltage, to be applied to the duty control terminal, wherein said delay time control circuit includes:
 a phase comparison circuit for comparing the phase of the output signal outputted from said fixed delay circuit with the phase of a signal inputted to said variable delay circuit to generate a signal depending on the phase difference; and a delay time control voltage generation circuit for generating said delay time control voltage to be applied to said delay time control terminal based on the signal depending on the phase difference outputted from said phase comparison circuit, wherein the semiconductor integrated circuit device comprises said delay locked loop circuit, a data output circuit coupled to receive the output signal of the duty adjusting circuit of the delay locked loop and a data output terminal to provide an output of said data output circuit, and wherein said fixed delay circuit provides, to the output signal thereof, a fixed delay corresponding to the sum of the delay to the input signal in the signal path up to said variable delay circuit from said input terminal and the delay in the signal path up to said output terminal from said data output circuit.

10. A semiconductor memory device comprising:

an input terminal coupled to receive an input signal;

a clock generation circuit comprising:

a variable delay circuit, coupled to said input terminal, provided with a delay time control terminal to give a certain delay to the input signal depending on a delay time control voltage applied to said delay time control terminal and to output a delayed signal;

a duty adjusting circuit for outputting an output of said clock generation circuit, coupled to receive said delayed signal from said variable delay circuit, provided with a duty control terminal to change the pulse width of an output signal of the duty adjusting circuit depending on a duty control voltage applied to said duty control terminal to adjust the duty ratio of said delayed signal;

a fixed delay circuit providing an output signal corresponding to the input signal with a predetermined delay relative to the input signal;

a delay time control circuit for generating said delay time control voltage to be applied to the delay time control terminal; and a duty control circuit for generating said duty control voltage, to be applied to the duty control terminal, wherein said delay time control circuit includes:

a phase comparison circuit for comparing the phase of the output signal outputted from said fixed delay circuit with the phase of a signal inputted to said variable delay circuit to generate a signal depending on the phase difference; and a delay time control voltage generation circuit for generating said delay time control voltage to be applied to said delay time control terminal based on the signal depending on the phase difference outputted from said phase comparison circuit, a data output circuit coupled to receive the output signal of said duty adjusting circuit of the clock generation circuit; and a data output terminal to provide an output of said data output circuit, wherein said fixed delay circuit provides, to the output signal thereof, a fixed delay corresponding to the sum of the delay to the input signal in the signal path up to said variable delay circuit from said input terminal and the delay in the signal path up to said output terminal from said data output and wherein data output from said clock generation circuit is carried out such that a clock signal which is generated by inputting the input signal supplied from outside to said clock generation circuit serves as the timing signal.

11. A semiconductor memory device according to claim 10, wherein said duty adjusting circuit is provided in a subsequent stage side of said variable delay circuit, said fixed delay circuit is provided in a subsequent stage of the duty adjusting circuit, and said duty adjusting circuit changes the pulse width of the output signal of the duty adjusting circuit by substantially equalizing the duty ratio of the signal outputted from said fixed delay circuit to the duty ratio of the output signal inputted to said variable delay circuit.

12. A semiconductor memory device according to wherein said delay time control circuit compares the phase of the rising edge of the signal inputted to said variable delay circuit with the phase of the rising edge of the output signal outputted from said fixed delay circuit, to generate said delay time control voltage applied to said delay time control terminal corresponding to the phase difference, and wherein said duty control circuit compares the phase of the falling edge of the signal inputted to said variable delay circuit with the phase of the falling edge of the output signal outputted from said fixed delay circuit, to generate said duty control voltage applied to said duty control terminal corresponding to the phase difference.

13. A semiconductor memory device according to claim 10, wherein said variable delay circuit is constituted to output an input differential signal by delaying the input signal, wherein the output signal outputted from said fixed delay circuit is also a differential signal, and wherein said duty control circuit is capable of generating said duty control voltage applied to said duty control terminal based on the differential signal outputted from said fixed delay circuit.

14. A clock generation circuit according to claim 10, wherein a phase comparison circuit included in said delay time control circuit is constituted to output the signal indicating the lead phase or delayed phase of two signals to be compared, and is also constituted so that a phase lock determination circuit is provided for determining the phase lock condition based on the signal indicating the leading phase or delayed phase, and wherein said duty control circuit selects, based on the signal indicating the phase lock condition outputted from a phase lock determination circuit, the signal corresponding to the phase difference outputted from a second phase comparison circuit or a differential signal outputted from said fixed delay circuit to generate said duty control voltage applied to said duty control terminal based on the selected signal.

15. A clock generation circuit according to claim 10, wherein said delay time control circuit compares the phase of the falling edge of the signal inputted to said variable delay circuit with the phase of the falling edge of the output signal outputted from said fixed delay circuit, to generate said delay time control voltage applied to said delay time control terminal corresponding to the phase difference, and wherein said duty control circuit compares the phase of the rising edge of the signal inputted to said variable delay circuit with the phase of the falling edge of the output signal outputted from said fixed delay circuit, to generate said duty control voltage applied to said duty control terminal corresponding to the phase difference.

* * * * *